US012568611B2

(12) United States Patent
Ahn

(10) Patent No.: US 12,568,611 B2
(45) Date of Patent: Mar. 3, 2026

(54) MEMORY DEVICE WITH CELL PADS HAVING DIAGONAL SIDEWALLS

(71) Applicant: SAMSUNG ELECTRONICS CO., LTD., Suwon-si (KR)

(72) Inventor: Junhyeok Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 523 days.

(21) Appl. No.: 18/098,202

(22) Filed: Jan. 18, 2023

(65) Prior Publication Data

US 2023/0284430 A1 Sep. 7, 2023

(30) Foreign Application Priority Data

Jan. 28, 2022 (KR) ......................... 10-2022-0013621

(51) Int. Cl.
H10B 12/00 (2023.01)

(52) U.S. Cl.
CPC ....... H10B 12/0335 (2023.02); H10B 12/485 (2023.02); H10B 12/315 (2023.02)

(58) Field of Classification Search
CPC . H10B 12/485; H10B 12/315; H10B 12/0335
See application file for complete search history.

(56) References Cited

U.S. PATENT DOCUMENTS

| | | | | |
|---|---|---|---|---|
| 9,379,114 B2 * | 6/2016 | Jeong | ................. | H10B 12/0335 |
| 9,865,602 B2 * | 1/2018 | Kwon | ................. | H10D 62/115 |
| 10,217,748 B2 * | 2/2019 | Takesako | .......... | H10B 12/0335 |
| 2021/0391259 A1 * | 12/2021 | Ahn | .................... | H10B 12/482 |

FOREIGN PATENT DOCUMENTS

| | | | | |
|---|---|---|---|---|
| CN | 108962893 A | * 12/2018 | ......... | H01L 23/5226 |
| CN | 109148376 | 7/2020 | | |
| CN | 111524888 A | 8/2020 | | |
| CN | 108962893 B | 1/2021 | | |

OTHER PUBLICATIONS

Office Action dated Dec. 8, 2023 issued in corresponding TW Patent Application No. 112102677.

* cited by examiner

*Primary Examiner* — Steven M Page
(74) *Attorney, Agent, or Firm* — Morgan, Lewis & Bockius LLP

(57) ABSTRACT

A semiconductor apparatus includes: a substrate in which a plurality of active areas are provided; a plurality of word lines formed on the substrate and located in a plurality of word line trenches extending in a first direction parallel to a top surface of the substrate; a plurality of bit line structures formed on the substrate, and extending in a second direction parallel to the top surface of the substrate and crossing the first direction; and a plurality of cell pad structures at least partially overlapping the plurality of active areas with the plurality of bit line structures therebetween, wherein each of the plurality of cell pad structures includes a pair of first side walls extending in the first direction and a pair of second side walls extending in a diagonal direction inclined with respect to the first direction and the second direction.

20 Claims, 21 Drawing Sheets

MEMORY DEVICE WITH CELL PADS HAVING DIAGONAL SIDEWALLS

CROSS-REFERENCE TO RELATED APPLICATION

This application claims priority under 35 U.S.C. § 119 to Korean Patent Application No. 10-2022-0013621, filed on Jan. 28, 2022, in the Korean Intellectual Property Office, the disclosure of which is incorporated by reference herein in its entirety.

TECHNICAL FIELD

The present inventive concept relates to a semiconductor apparatus and a method of manufacturing the same, and more particularly, to a semiconductor apparatus including a bit line and a method of manufacturing the semiconductor apparatus.

DISCUSSION OF THE RELATED ART

As semiconductor apparatuses have been downscaled, sizes of individual micro circuit patterns for implementing semiconductor devices having been further reduced. In addition, as integrated circuit devices have become increasingly integrated, line widths of bit lines have become further reduced and a process for forming a contact between bit lines have become increasingly difficult.

SUMMARY

According to an embodiment of the present inventive concept, a semiconductor apparatus includes: a substrate in which a plurality of active areas are provided; a plurality of word lines formed on the substrate and located in a plurality of word line trenches extending in a first direction parallel to a top surface of the substrate; a plurality of bit line structures formed on the substrate, and extending in a second direction parallel to the top surface of the substrate and crossing the first direction; and a plurality of cell pad structures at least partially overlapping the plurality of active areas with the plurality of bit line structures therebetween, wherein each of the plurality of cell pad structures includes a pair of first side walls extending in the first direction and a pair of second side walls extending in a diagonal direction inclined with respect to the first direction and the second direction.

According to an embodiment of the present inventive concept, a semiconductor apparatus includes: a substrate in which a plurality of active areas are provided; a plurality of word lines formed on the substrate and located in a plurality of word line trenches extending in a first direction parallel to a top surface of the substrate; a plurality of bit line structures formed on the substrate, and extending in a second direction parallel to the top surface of the substrate and crossing the first direction; and a plurality of cell pad structures at least partially overlapping the plurality of active areas with the plurality of bit line structures therebetween, wherein each of the plurality of cell pad structures extend in a diagonal direction inclined with respect to the first direction and the second direction.

According to an embodiment of the present inventive concept, a semiconductor apparatus includes: a substrate in which a plurality of active areas are provided; a plurality of word lines formed on the substrate and located in a plurality of word line trenches extending in a first direction parallel to a top surface of the substrate; a plurality of bit line structures formed on the substrate, and extending in a second direction parallel to the top surface of the substrate and crossing the first direction; a plurality of first cell pad separation patterns extending in the first direction on the substrate; a plurality of second cell pad separation patterns extending in a diagonal direction on the substrate, wherein the diagonal direction extends between the first direction and the second direction; and a plurality of cell pad structures located in the plurality of active areas, wherein each of the plurality of cell pad structures includes a first side wall and a second side wall, wherein the first side wall of each of the plurality of cell pad structures contacts one of the plurality of first cell pad separation patterns, and the second side wall of each of the plurality of cell pad structures contacts one of the plurality of second cell pad separation patterns.

BRIEF DESCRIPTION OF THE DRAWINGS

The above and other aspects of the present inventive concept will become more apparent by describing in detail embodiments thereof, with reference to the accompanying drawings, in which:

FIGS. 6A, 6B, 7A, 7B, 8A, 8B, 9A, 9B, 10A, 10B, 11A, 11B, 12A, 12B, 13A and 13B are cross-sectional views illustrating a method of manufacturing a semiconductor apparatus, according to an embodiment of the present inventive concept. FIGS. 6A, 7A, 8A, 9A, 10A, 11A, 12A, and 13A are plan views according to a process order, and FIGS. 6B, 7B, 8B, 9B, 10B, JIB, 12B, and 13B are cross-sectional views taken along lines A-A', B-B', and C-C' of FIGS. 6A, 7A, 8A, 9A, 10A, 11A, 12A, and 13A.

DETAILED DESCRIPTION OF THE EMBODIMENTS

Hereinafter, embodiments of the present inventive concept will be described in detail with reference to the attached drawings.

Figure 1:
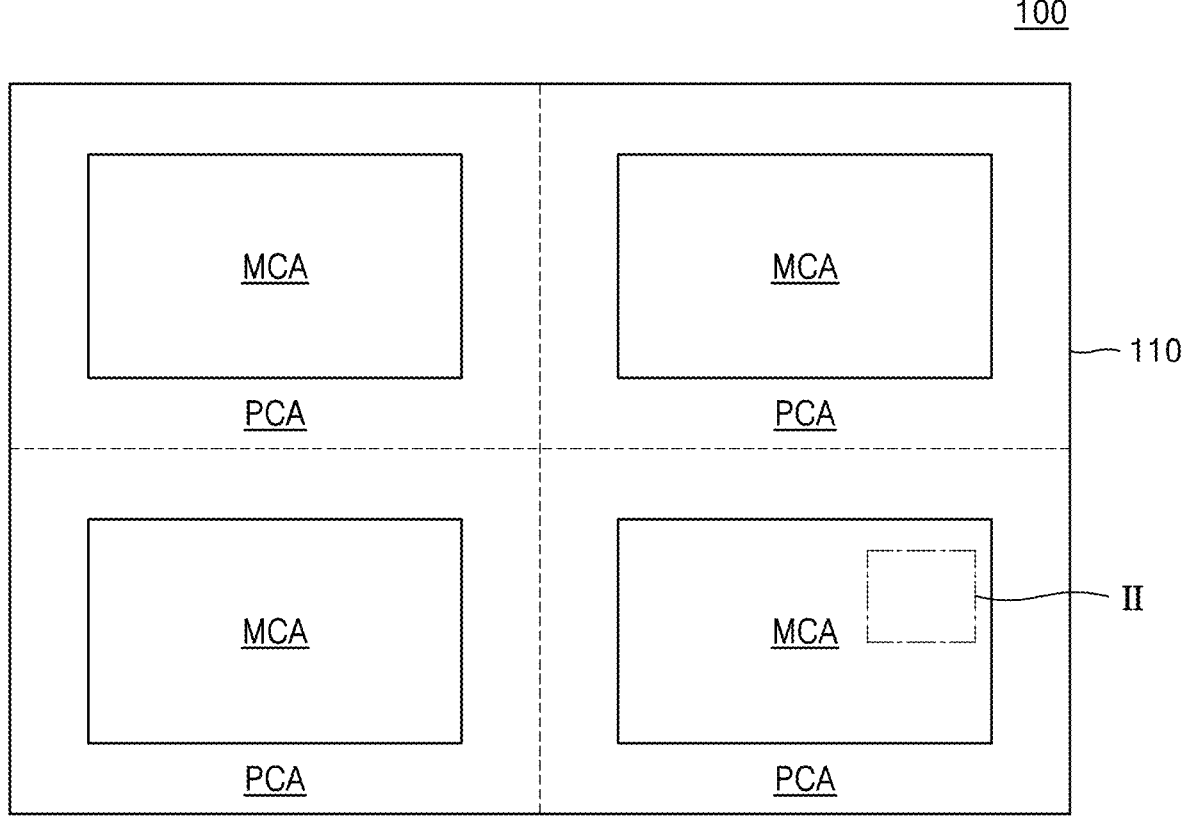
FIG. 1 is a layout view illustrating a semiconductor apparatus, according to an embodiment of the present inventive concept.
Figure 2:
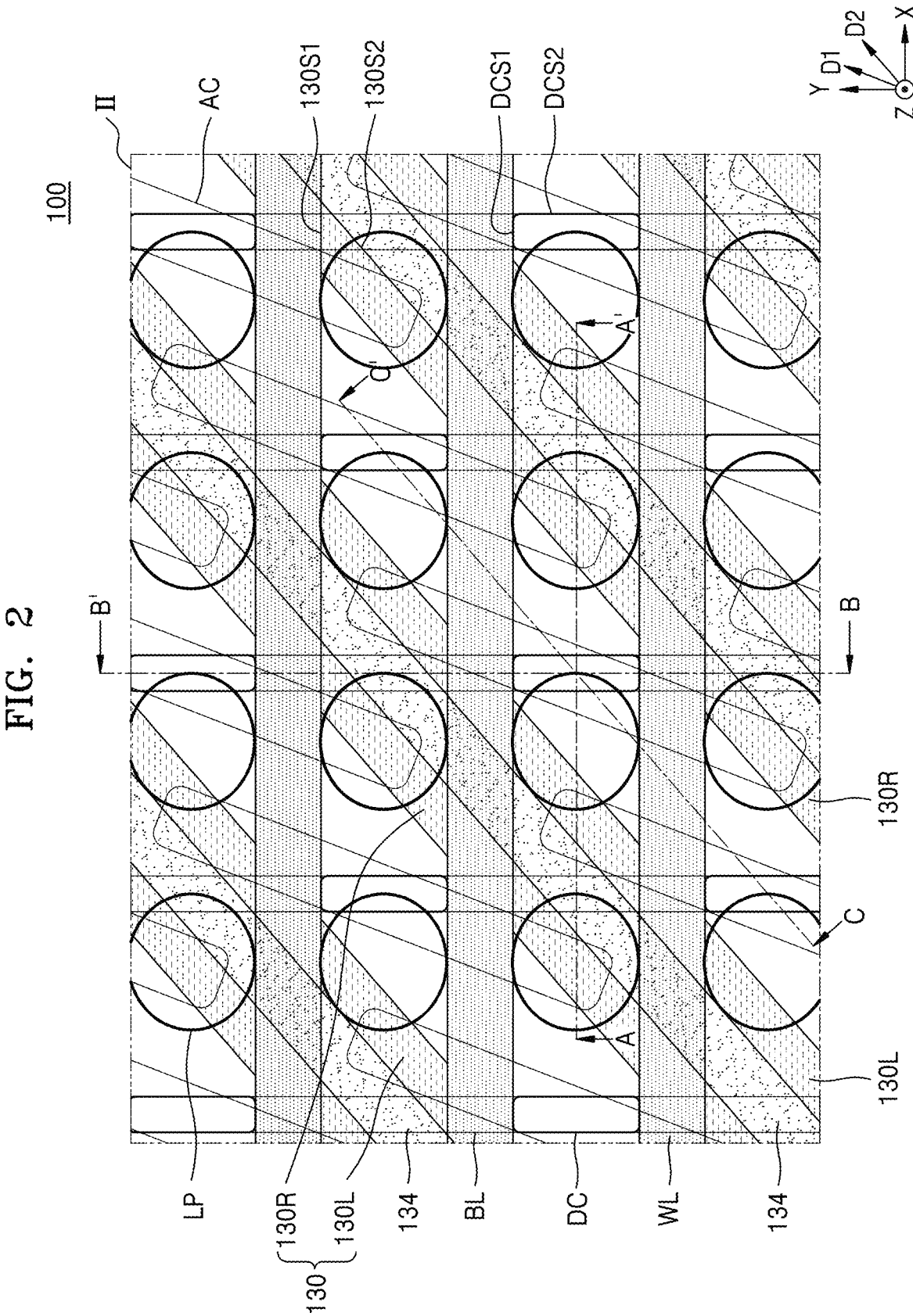
FIG. 2 is an enlarged layout view illustrating a portion II of FIG. 1.
Figure 3:
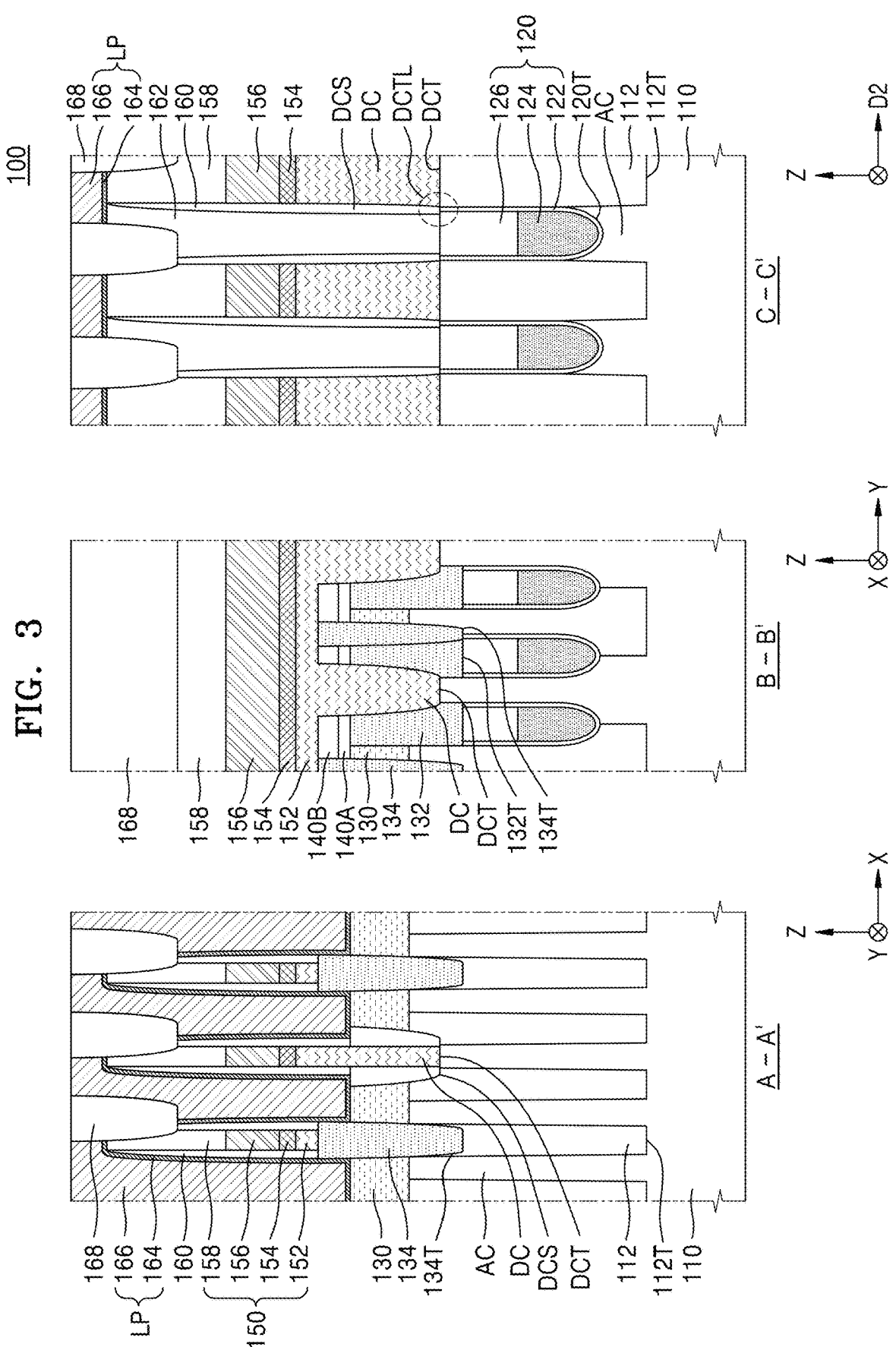
FIG. 3 is cross-sectional views taken along lines A-A', B-B', and C-C' of FIG. 2.

FIG. 1 is a layout view illustrating a semiconductor apparatus 100, according to an embodiment of the present inventive concept. FIG. 2 is an enlarged layout view illustrating a portion II of FIG. 1. FIG. 3 is cross-sectional views taken along line A-A', B-B', and C-C' of FIG. 2.

Referring to FIGS. 1 through 3, the semiconductor apparatus 100 may include a substrate 110 including a cell array area MCA and a peripheral circuit area PCA. The cell array area MCA may be a memory cell area of a dynamic random-access memory (DRAM) device, and the peripheral circuit area PCA may be a core area or a peripheral circuit area of the DRAM device. For example, the cell array area MCA may include a cell transistor CTR and a capacitor structure 180 connected to the cell transistor CTR, and the peripheral circuit area PCA may include a peripheral circuit transistor for transmitting a signal and/or power to the cell transistor CTR included in the cell array area MCA. In an embodiment of the present inventive concept, the peripheral circuit transistor may constitute various circuits such as a command decoder, a control logic, an address buffer, a row decoder, a column decoder, a sense amplifier, and a data input/output circuit.

An isolation trench 112T may be formed in the substrate 110, and an isolation layer 112 may be formed in the isolation trench 112T. A plurality of active areas AC may be defined in the substrate 110 by the isolation layer 112.

Each of the plurality of active areas AC may be arranged to have a long axis in a first diagonal direction D1 inclined with respect to a first horizontal direction X and a second horizontal direction Y. A plurality of word lines WL may extend parallel to one another in the first horizontal direction X across the plurality of active areas AC. A plurality of bit lines BL may be located above the plurality of word lines WL and may extend parallel to one another in the second horizontal direction Y. The plurality of bit lines BL may be connected to the plurality of active areas AC through a direct contact DC.

A plurality of cell pad structures 130 may be formed between two adjacent bit lines BL from among the plurality of bit lines BL. The plurality of cell pad structures 130 may extend in a second diagonal direction D2 inclined with respect to the first horizontal direction X and the second horizontal direction Y. The plurality of cell pad structures 130 may include a first cell pad 130L and a second cell pad 130R spaced apart from each other with the direct contact DC therebetween. The direct contact DC may be located between the first cell pad 130L and the second cell pad 130R, which are spaced apart from each other in the first horizontal direction X, and a second cell pad separation pattern 134 may be located between the second cell pad 130R and the first cell pad 130L, which are spaced apart from each other in the first horizontal direction X.

The first cell pad 130L and the second cell pad 130R may have the same shape as each other, and the first cell pad 130L and the second cell pad 130R may have the same horizontal cross-sectional area as each other. Each of the plurality of cell pad structures 130 may have a parallelogram-shaped horizontal cross-section, and may include a pair of first side walls 130S1 extending in the first horizontal direction X and a pair of second side walls 130S2 extending in the second diagonal direction D2.

A plurality of landing pads LP may be formed on the plurality of cell pad structures 130. The plurality of cell pad structures 130 and the plurality of landing pads LP may connect a lower electrode of a capacitor structure formed over the plurality of bit lines BL to the active area AC. Each of the plurality of landing pads LP may partially overlap the cell pad structure 130 and the bit line BL.

The substrate 110 may include silicon, for example, single crystalline silicon, polycrystalline silicon, or amorphous silicon. In an embodiment of the present inventive concept, the substrate 110 may include at least one of Ge, SiGe, SiC, GaAs, InAs, and/or InP. In an embodiment of the present inventive concept, the substrate 110 may include a conductive region, for example, a well doped with impurities or a structure doped with impurities. The isolation layer 112 may include, for example, an oxide film, a nitride film, or a combination thereof.

A plurality of word line trenches 120T extending in the first direction (X direction) may be located in the substrate 110, and a buried gate structure 120 may be located in each of the plurality of word line trenches 120T. The buried gate structure 120 may include a gate dielectric film 122, a gate electrode 124, and a capping insulating film 126 located in each of the plurality of word line trenches 120T. A plurality of gate electrodes 124 may correspond to a plurality of word lines WL of FIG. 2.

A plurality of gate dielectric films 122 may include, for example, a silicon oxide film, a silicon nitride film, a silicon oxynitride film, an oxide/nitride/oxide (ONO) film, or a high-k dielectric film having a higher dielectric constant than that of a silicon oxide film. The plurality of gate electrodes 124 may include, for example, Ti, TiN, Ta, TaN, W, WN, TiSiN, WSiN, or a combination thereof. A plurality of capping insulating films 126 may include, for example, a silicon oxide film, a silicon nitride film, a silicon oxynitride film, or a combination thereof.

A plurality of direct contacts DC may be formed in a plurality of direct contact trenches DCT on the substrate 110. The plurality of direct contacts DC may be connected to a plurality of active areas AC. The plurality of direct contacts DC may include, for example, TiN, TiSiN, W, tungsten, silicide, doped polysilicon, or a combination thereof. The direct contact trench DCT may extend in the second horizontal direction Y, and a bottom portion of the direct contact trench DCT may have a substantially flat bottom surface. A direct contact spacer DCS may cover the bottom of the direct contact DC in the direct contact trench DCT.

The direct contact trench DCT may extend in the second horizontal direction Y, and tail portions DCTL may be formed on bottom portions of side walls of the direct contact DC spaced apart in the second diagonal direction D2. The tail portion DCTL may be formed by forming a conductive layer 152L filling the direct contact trench DCT, and then patterning the conductive layer 152L to define a width of the direct contact DC in the first horizontal direction X.

In a plan view, the direct contact DC may have, for example, a rectangular horizontal cross-section. For example, the direct contact DC may include a pair of first side walls DCS1 extending in the first horizontal direction X, and a pair of second side walls DCS2 extending in the second horizontal direction Y.

A plurality of bit line structures 150 may longitudinally extend in the second horizontal direction Y on the substrate 110 and on the plurality of direct contacts DC. Each of the plurality of bit line structures 150 may be connected to the active area AC through the direct contact DC. Each of the plurality of bit line structures 150 may include a conductive layer 152, an intermediate conductive layer 154, a bit line conductive layer 156, and a bit line capping layer 158, and the bit line conductive layer 156 may correspond to the bit line BL of FIG. 2.

In an embodiment of the present inventive concept, the conductive layer 152 may include, for example, polysilicon, and the intermediate conductive layer 154 may include at least one of, for example, TiN, TiSiN, cobalt silicide, nickel silicide, and/or tungsten silicide. The bit line conductive layer 156 may include at least one of, for example, ruthenium (Ru), tungsten (W), cobalt (Co), titanium (Ti), and/or titanium nitride (TiN). The bit line capping layer 158 may include at least one of, for example, silicon nitride, silicon oxide, and/or silicon oxynitride. Bit line spacers 160 may be located on both side walls of each of the bit line structures 150.

A plurality of cell pad structures 130 may be located between the plurality of bit line structures 150. For example, one cell pad structure 130 may be located at a vertical level lower than that of the bit line structure 150 and may be located between two adjacent bit line structures 150. A bottom surface of the cell pad structure 130 may contact the active area AC.

In an embodiment of the present inventive concept, the plurality of cell pad structures 130 may include, for example, Si, Ge, W, WN, Co, Ni, Al, Mo, Ru, Ti, TiN, Ta, TaN, Cu, or a combination thereof.

A first cell pad separation pattern 132 may be located between two cell pad structures 130 in the second horizontal direction Y, and the second cell pad separation pattern 134 may be located between two cell pad structures 130 in the first horizontal direction X. The first cell pad separation pattern 132 may be located in a first cell pad separation trench 132T and may extend in the first horizontal direction X, and may be located at a position vertically overlapping the buried gate structure 120. The second cell pad separation pattern 134 may be located in a second cell pad separation trench 134T and may extend in the second diagonal direction D2. Each of the first cell pad separation pattern 132 and the second cell pad separation pattern 134 may include, for example, silicon nitride.

In an embodiment of the present inventive concept, a bottom surface of the first cell pad separation pattern 132 may be located at a level lower than that of a bottom surface of the direct contact DC, and a bottom surface of the second cell pad separation pattern 134 may be located at a level lower than that of the bottom surface of the direct contact DC. For example, each of the first cell pad separation trench 132T and the second cell pad separation trench 134T may have a bottom surface located at a level lower than that of a bottom surface of the direct contact trench DCT. For example, a vertical distance between the direct contact trench DCT and a top surface of the gate electrode 124 may be greater than a vertical distance between the first cell pad separation trench 132T and the top surface of the gate electrode 124 and/or a vertical distance between the second cell pad separation trench 134T and the top surface of the gate electrode 124.

A first insulating layer 140A and a second insulating layer 140B may be sequentially located between the plurality of cell pad structures 130 and the bit line structure 150. The first insulating layer 140A may include, for example, silicon oxide, and the second insulating layer 140B may include, for example, silicon nitride.

A plurality of insulating fences 162 may be located in the second horizontal direction Y between two adjacent bit line structures 150. For example, the plurality of insulating fences 162 may be located between adjacent intermediated conductive layers 154, adjacent bit line conductive layers 156, and adjacent bit line capping layers 158. The plurality of insulating fences 162 may be located at positions vertically overlapping the plurality of word line trenches 120T.

A plurality of landing pads LP may be located on the plurality of cell pad structures 130. Each of the plurality of landing pads LP may include a conductive barrier film 164 and a landing pad conductive layer 166. The conductive barrier film 164 may include, for example, Ti, TiN, or a combination thereof. The landing pad conductive layer 166 may include, for example, a metal, metal nitride, conductive polysilicon, or a combination thereof. For example, the landing pad conductive layer 166 may include W. The plurality of landing pads LP may have a plurality of island-type pattern shapes in a plan view.

The plurality of landing pads LP may be electrically insulated from one another by an insulating pattern 168 surrounding the plurality of landing pads LP. The insulating pattern 168 may include at least one of, for example, silicon nitride, silicon oxide, and/or silicon oxynitride.

In general, according to a comparative example, an island-type direct contact hole is formed by removing a portion of the cell pad structure 130, and a direct contact is formed by filling a conductive material in the direct contact hole. However, when misalignment occurs in a patterning process for forming the direct contact hole, a cell pad structure having a small area may be locally formed, and in this case, contact resistance between an active area and a landing pad may increase, thereby degrading electrical characteristics of a semiconductor apparatus.

However, according to an embodiment of the present inventive concept, a cell pad preliminary pattern 130P2 may be formed by forming the first cell pad separation pattern 132 and the second cell pad separation pattern 134 to intersect each other at an acute angle, and then, a first cell pad 132L and a second cell pad 132R may be formed by forming the direct contact trench DCT through double patterning using a spacer 144 and a reference pattern 142 extending in the second diagonal direction D2. Accordingly, the first cell pad 132L and the second cell pad 132R may be formed to have substantially the same or the same area, and the semiconductor apparatus 100 may have excellent electrical characteristics.

Figure 4:
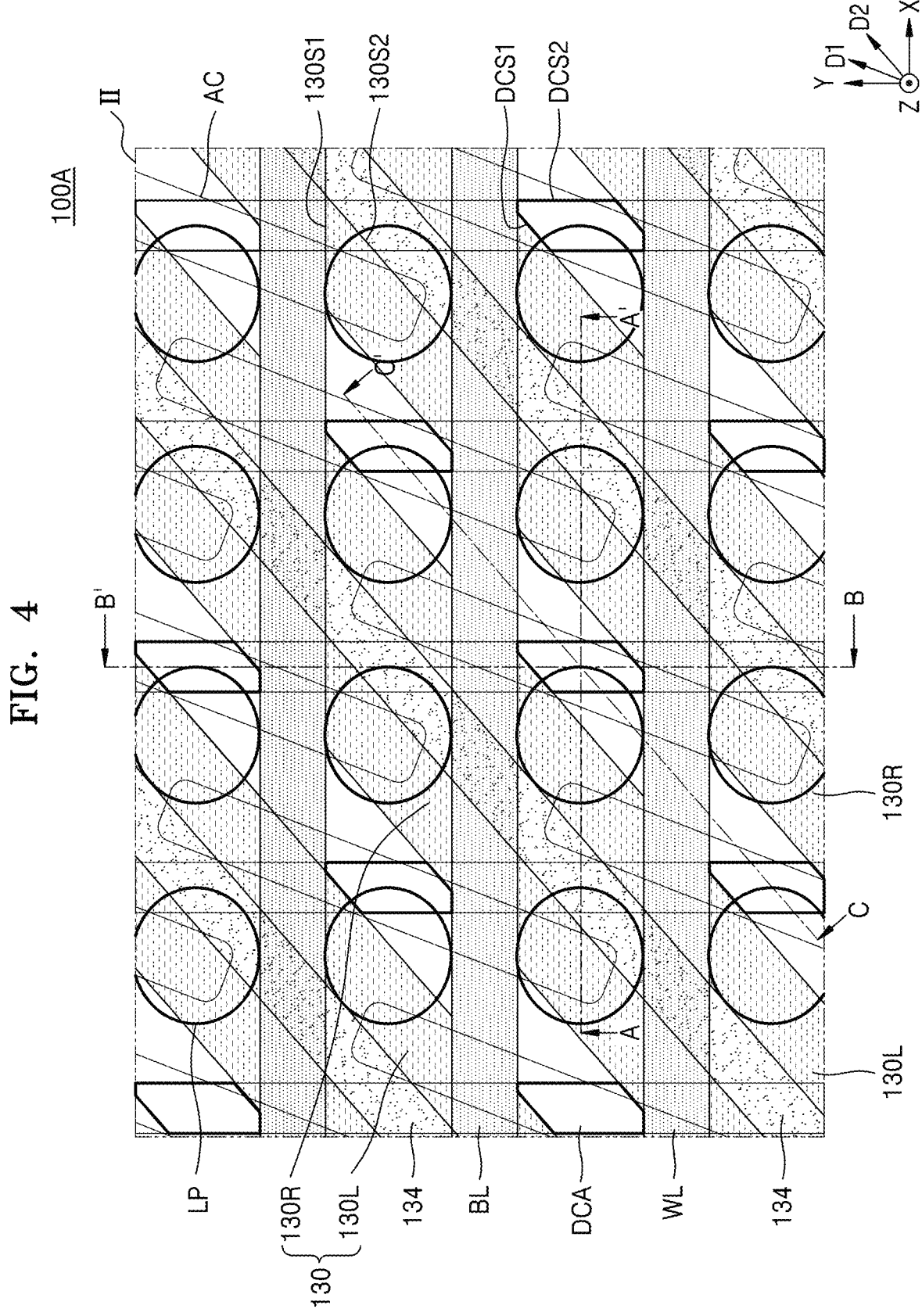
FIG. 4 is a layout view illustrating a semiconductor apparatus, according to an embodiment of the present inventive concept.
Figure 5:
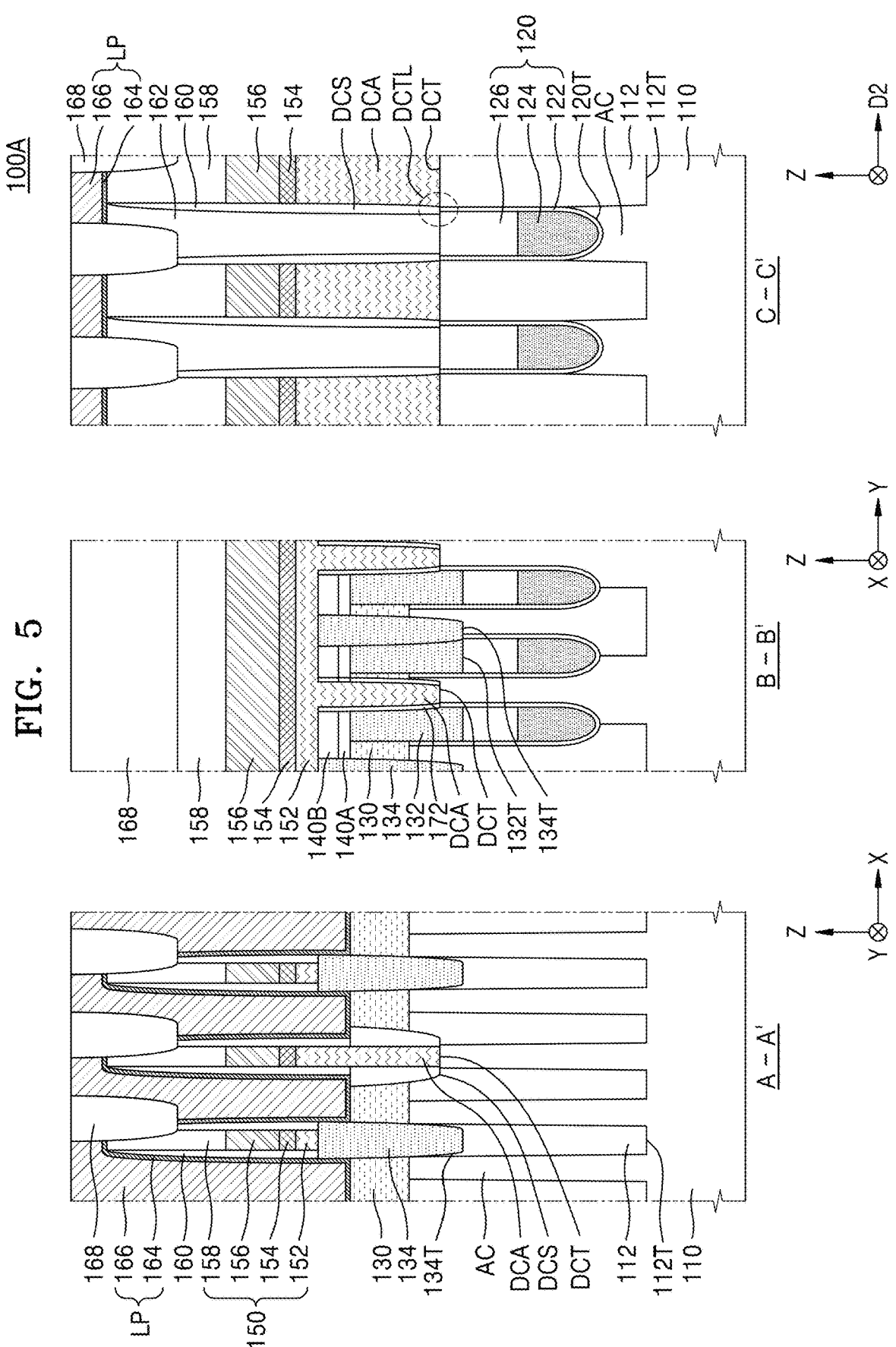
FIG. 5 is cross-sectional views taken along lines A-A', B-B', and C-C' of FIG. 4.

FIG. 4 is a layout view illustrating a semiconductor apparatus 100A, according to an embodiment of the present inventive concept. FIG. 5 is cross-sectional views taken along line A-A', B-B', and C-C' of FIG. 4.

Referring to FIGS. 4 and 5, the plurality of cell pad structures 130 may extend in the second diagonal direction D2 inclined with respect to the first horizontal direction X and the second horizontal direction Y. The plurality of cell pad structures 130 may include the first cell pad 130L and the second cell pad 130R spaced apart from each other with a direct contact DCA therebetween. The direct contact DCA may be located between the first cell pad 132L and the second cell pad 130R that are spaced apart from each other in the first horizontal direction X, and the second cell pad separation pattern 134 may be located between the second cell pad 130R and the first cell pad 130L that are spaced apart from each other in the first horizontal direction X.

Each of the plurality of cell pad structures 130 may have a parallelogram-shaped horizontal cross-section, and may include a pair of first side walls 130S1 extending in the first horizontal direction X and a pair of second side walls 130S2 extending in the second diagonal direction D2.

The direct contact DCA may be located between the first cell pad 130L and the second cell pad 130R and is adjacent to both the first cell pad 130L and the second cell pad 130R. In an embodiment of the present inventive concept, the direct contact DCA may extend in the second diagonal direction D2. In an embodiment of the present inventive concept, the direct contact DCA may have a parallelogram-shaped horizontal cross-section, or a parallelogram-shaped horizontal cross-section with some cut corners (e.g., a hexagonal horizontal cross-section). For example, the direct contact DCA may include a pair of first side walls DCS1 extending in the second diagonal direction D2, and a pair of second side walls DCS2 extending in the second horizontal direction Y. The pair of first side walls DCS1 extending in the second diagonal direction D2 may face the pair of second side walls 130S2 of the cell pad structure 130.

An insulating liner 172 may be located between the direct contact DCA and the cell pad structure 130. The insulating liner 172 may be located on a side wall of the direct contact trench DCT, and the direct contact DCA and the cell pad structure 130 may be electrically insulated from each other by the insulating liner 172. The insulating liner 172 may include, for example, silicon nitride or silicon oxide.

FIGS. 6A through 13B are cross-sectional views illustrating a method of manufacturing the semiconductor apparatus 100, according to an embodiment of the present inventive concept. In detail, FIGS. 6A, 7A, 8A, 9A, 10A, 11A, 12A, and 13A are plan views according to a process order, and FIGS. 6B, 7B, 8B, 9B, 10B, 11B, 12B, and 13B are cross-sectional views taken along lines A-A', B-B', and C-C' of FIGS. 6A, 7A, 8A, 9A, 10A, 11A, 12A, and 13A. In FIGS. 6A through 13B, the same reference numerals as those in FIGS. 1 through 5 denote the same elements, and thus, repetitive descriptions may be omitted.

Figure 6A:
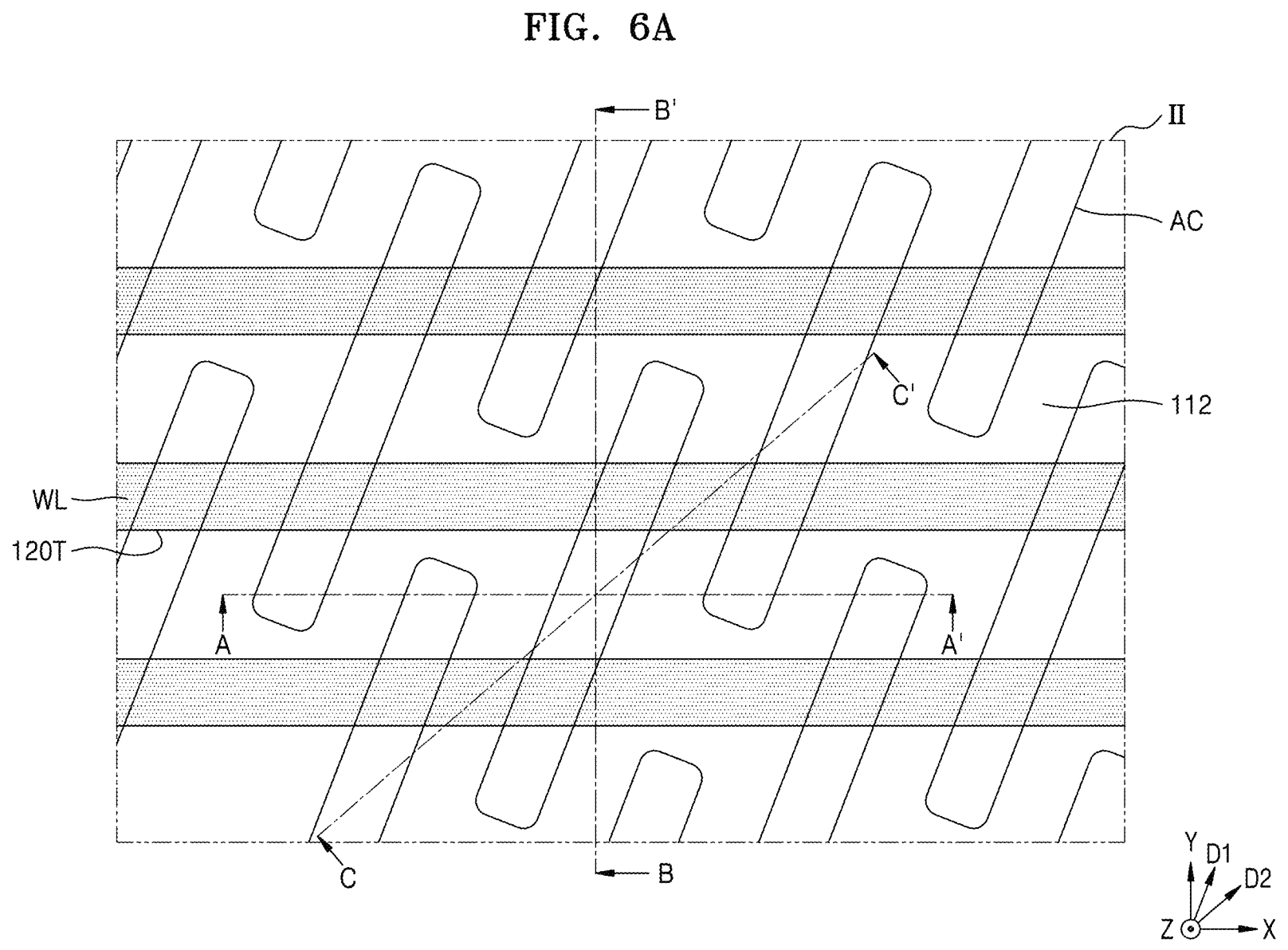
Figure 6B:
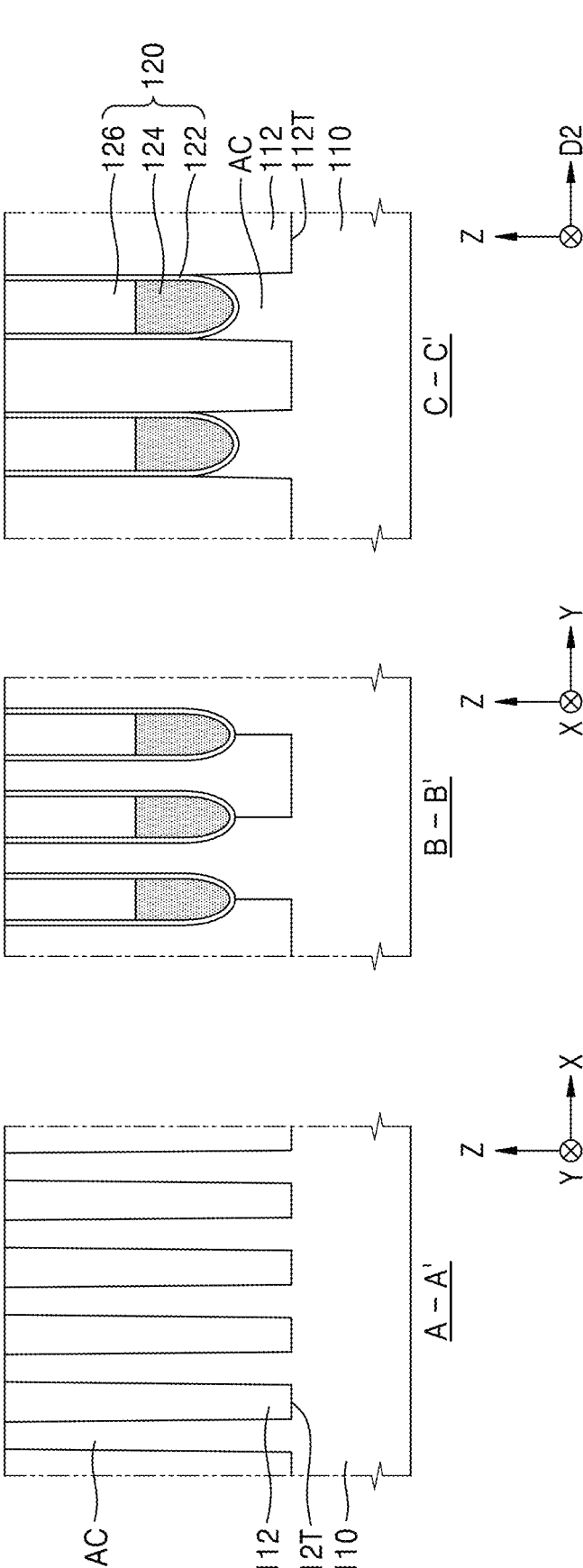

Referring to FIGS. 6A and 6B, a plurality of isolation trenches 112T may be formed in the cell array area MCA of the substrate 110.

Next, the isolation layer 112 filling each of the plurality of isolation trenches 112T may be formed. A plurality of first active areas AC are defined in the substrate 110 by the isolation layer 112. The plurality of first active areas AC may extend in the first diagonal direction D1 inclined at a certain angle with respect to a first horizontal direction X1 and the second horizontal direction Y.

In an embodiment of the present inventive concept, the isolation layer 112 may be formed of silicon oxide, silicon nitride, silicon oxynitride, or a combination thereof. In an embodiment of the present inventive concept, the isolation layer 112 may have, but is not limited to, a double-layer structure including a silicon oxide layer and a silicon nitride layer.

The word line trench 120T may be formed by forming a mask pattern on the substrate 110, and removing a portion of the substrate 110 by using the mask pattern as an etch mask. For example, the mask pattern for forming the word line trench 120T may be formed by using, but is not limited to, double patterning technology (DPT) or quadruple patterning technology (QPT).

Next, the gate dielectric film 122, the gate electrode 124, and the capping insulating film 126 may be sequentially formed in the word line trench 120T.

For example, the gate dielectric film 122 may be conformably located on an inner wall of the word line trench 120T. The gate electrode 124 may be formed by filling the word line trench 120T with a conductive layer and then etching back an upper portion of the conductive layer to expose a part of an upper portion of the word line trench 120T. The capping insulating film 126 may be formed by filling the remaining portion of the word line trench 120T with an insulating material and planarizing the insulating material until a top surface of a buried insulating layer 114A is exposed.

Figure 7A:
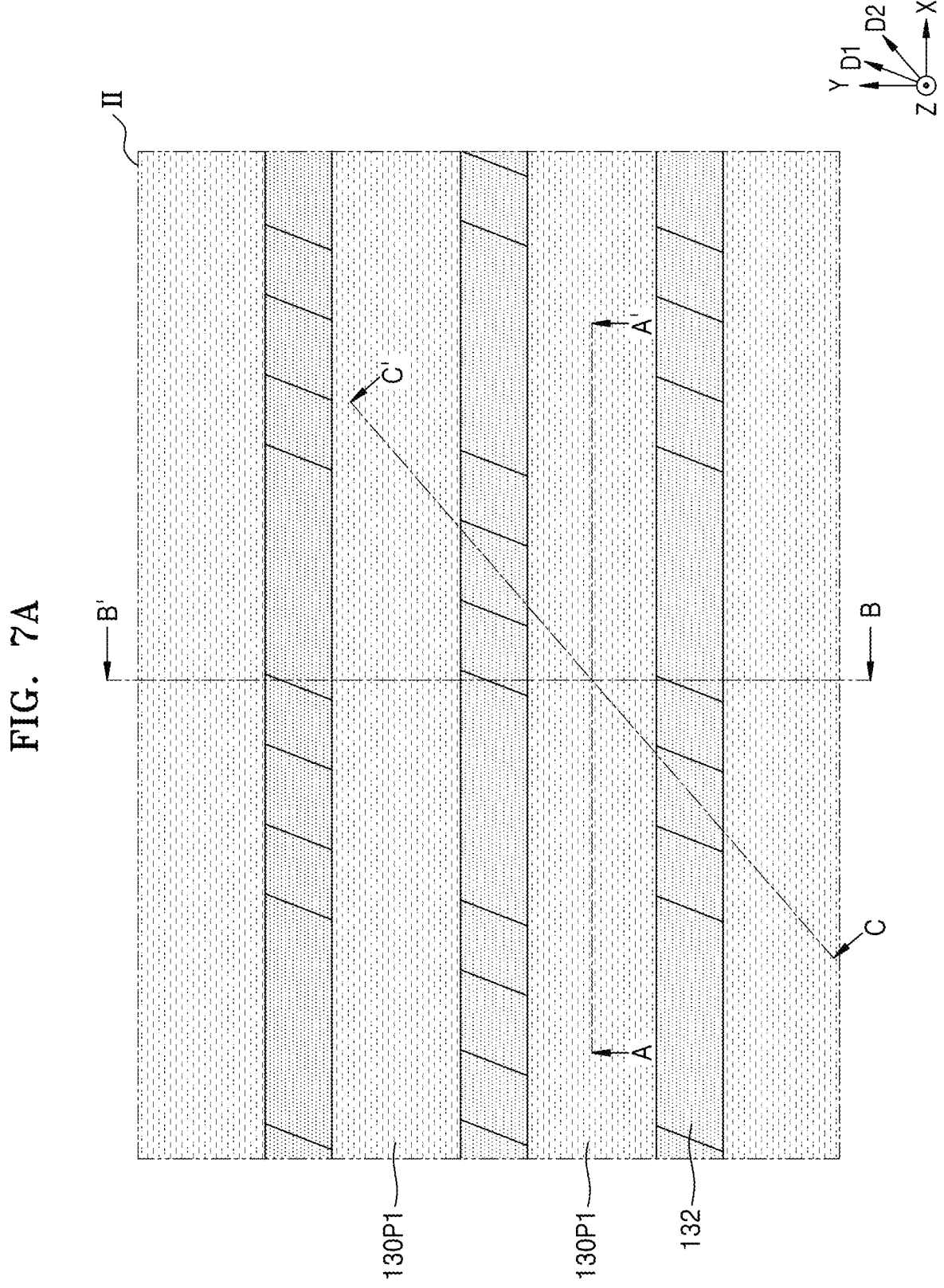
Figure 7B:
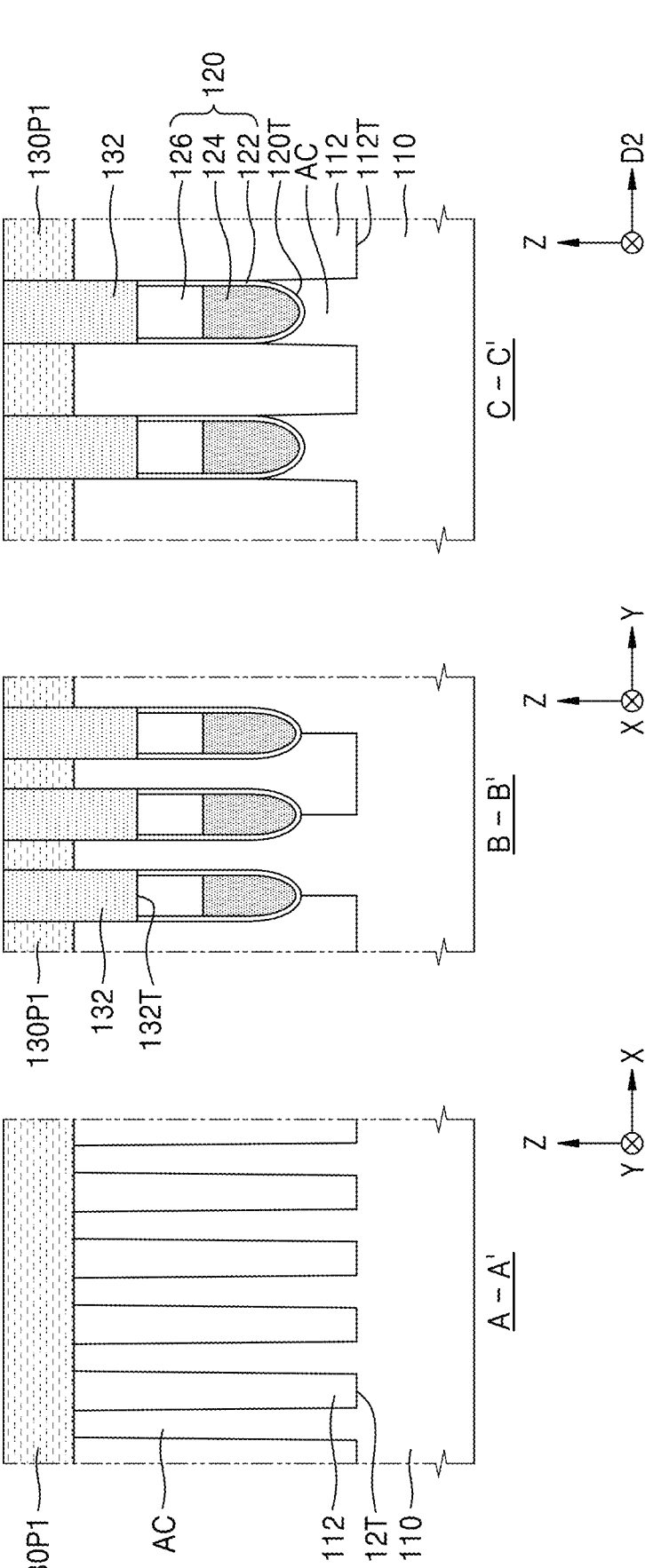

Referring to FIGS. 7A and 7B, a plurality of cell pad line patterns 130P1 may be formed by forming a conductive layer on the active area AC and the isolation layer 112, forming a mask pattern M10 having an opening portion M10H that has a line shape and that extends in the first horizontal direction X on the conductive layer, and patterning the conductive layer by using the mask pattern M10 as an etch mask. For example, a line shape may be a rectangular shape.

In an embodiment of the present inventive concept, the cell pad line pattern 130P1 may include Si, Ge, W, WN, Co, Ni, Al, Mo, Ru, Ti, TiN, Ta, TaN, Cu, or a combination thereof. For example, the cell pad line pattern 130P1 may include polysilicon.

Next, a plurality of first cell pad separation patterns 132 may be formed by forming an insulating layer in a space between the plurality of cell pad line patterns 130P1 and planarizing an upper portion of the insulating layer until top surfaces of the plurality of cell pad line patterns 130P1 are exposed.

In an embodiment of the present inventive concept, the plurality of cell pad line patterns 130P1 may have line shapes extending in the first horizontal direction X. In addition, the plurality of first cell pad separation patterns 132 may have line shapes extending in the first horizontal direction X. For example, the plurality of cell pad line patterns 130P1 and the plurality of first cell pad separation patterns 132 may be alternately arranged in the second horizontal direction Y, and each first cell pad separation pattern 132 may be located between two adjacent cell pad line patterns 130P1.

In an embodiment of the present inventive concept, the plurality of first cell pad separation patterns 132 may be located to vertically overlap the word line trench 120T, and the plurality of first cell pad separation patterns 132 may be located on the capping insulating film 126.

Figure 8A:
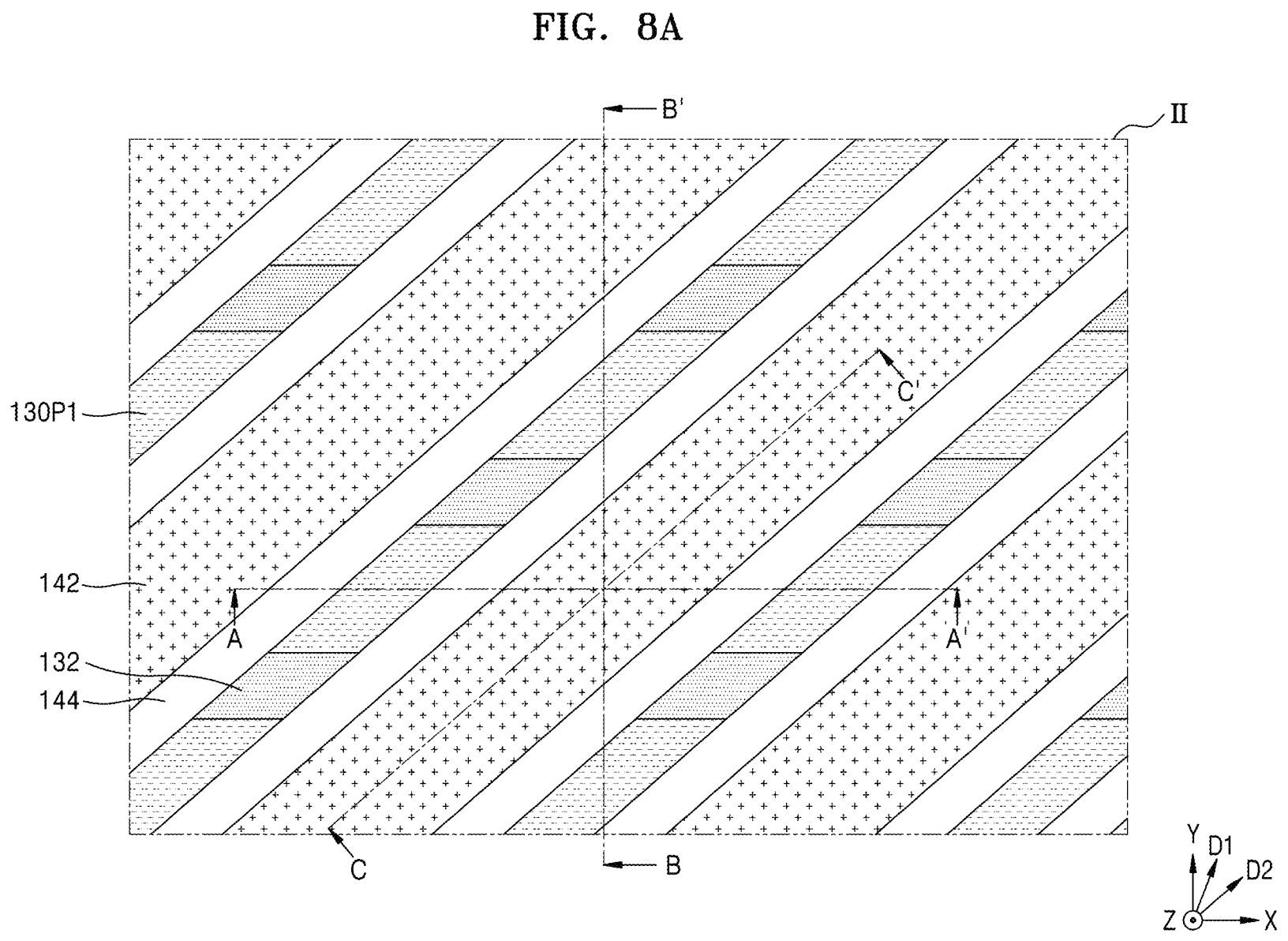
Figure 8B:
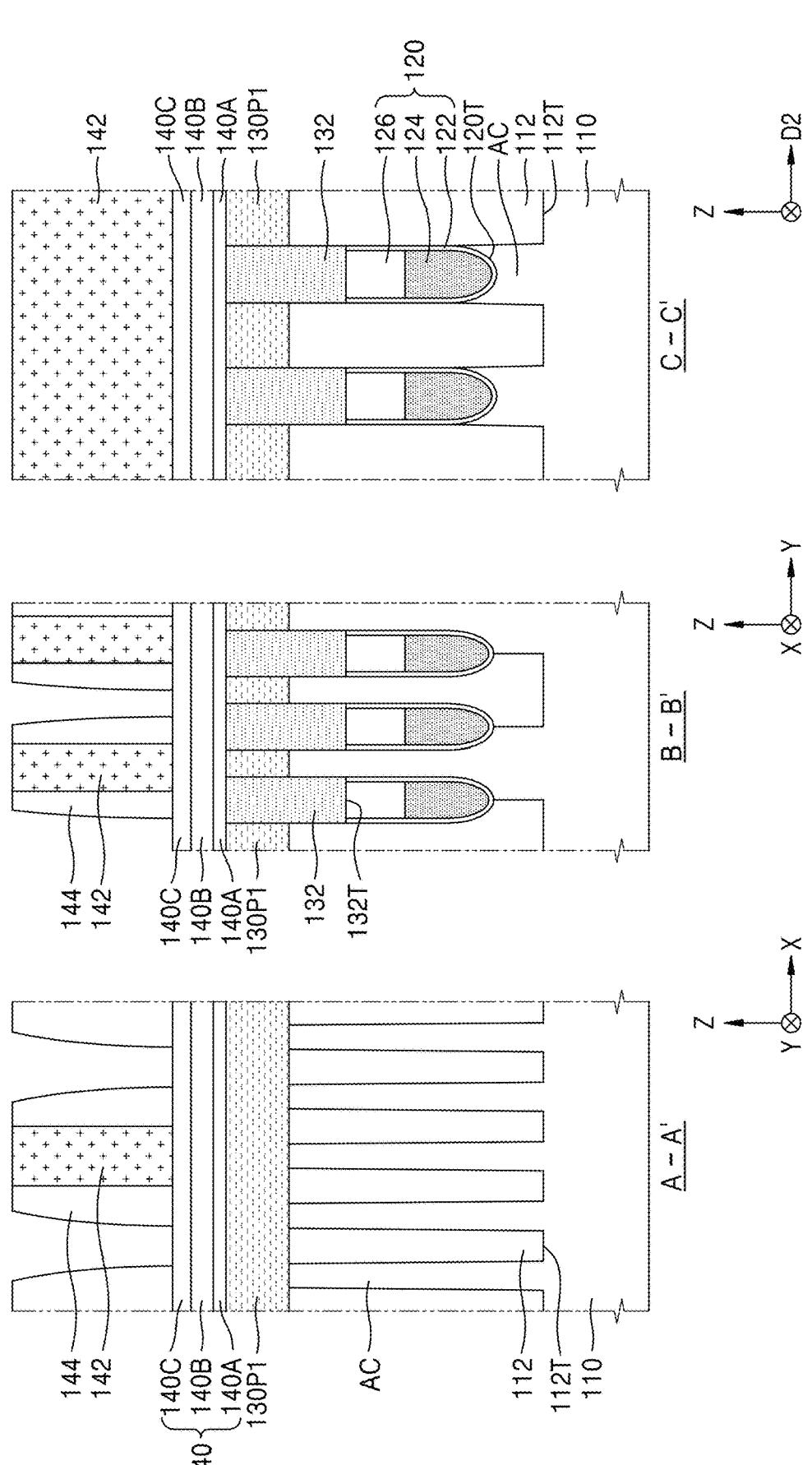

Referring to FIGS. 8A and 8B, a buffer insulating layer 140 may be formed on the plurality of cell pad line patterns 130P1 and the plurality of first cell pad separation patterns 132. In an embodiment of the present inventive concept, the buffer insulating layer 140 may have a stacked structure including the first insulating layer 140A, the second insulating layer 140B, and a third insulating layer 140C stacked on each other.

Next, the reference pattern 142 including an opening portion and extending in the second diagonal direction D2 inclined at a certain angle with respect to the first horizontal direction X1 and the second horizontal direction Y may be formed on the buffer insulating layer 140. For example, the second diagonal direction D2 may be inclined at an acute angle with respect to the first diagonal direction D1. For example, the second diagonal direction D2 may be inclined at an angle of about 10° to about 30° with respect to the first diagonal direction D1.

In an embodiment of the present inventive concept, the reference pattern 142 may include a plurality of line patterns provided by a plurality of opening portions having line shapes, and the plurality of line patterns of the reference pattern 142 may be arranged with a first pitch. For example, the plurality of line patterns may have a first width in the second diagonal direction D2 and may be arranged at first intervals. The first width may correspond to a width of the direct contact trench DCT (see FIG. 10B).

Next, a pair of spacers 144 may be formed by forming a spacer layer conformally covering a top surface and a side wall of the reference pattern 142 on the buffer insulating layer 140, and performing an anisotropic etching process on the spacer layer so that a portion of the spacer layer located on the top surface of the reference pattern 142 and a bottom portion of the opening portion of the reference pattern 142 is removed and a portion of the spacer layer located on the side wall of the reference pattern 142 is left.

In an embodiment of the present inventive concept, the pair of spacers 144 may be located on both side walls of the reference pattern 142, and each of the spacers 144 may have a second width that is substantially the same as the first width in the second diagonal direction D2. In addition, because one pair of spacers 144 are formed on side walls of the opening portion, a width of a top surface of the buffer insulating layer 140 exposed through the bottom portion of the opening portion may be reduced.

Figure 9A:
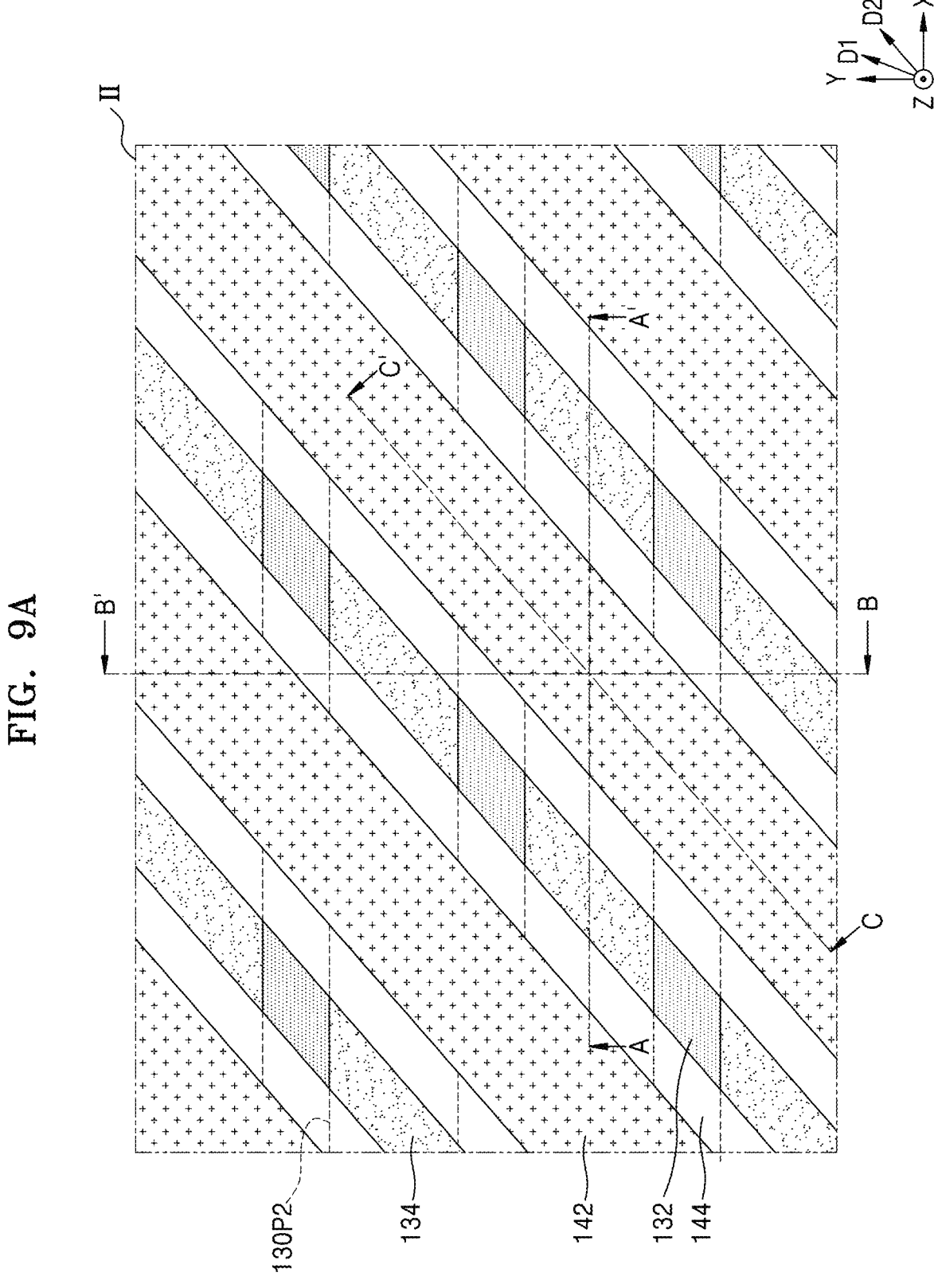
Figure 9B:
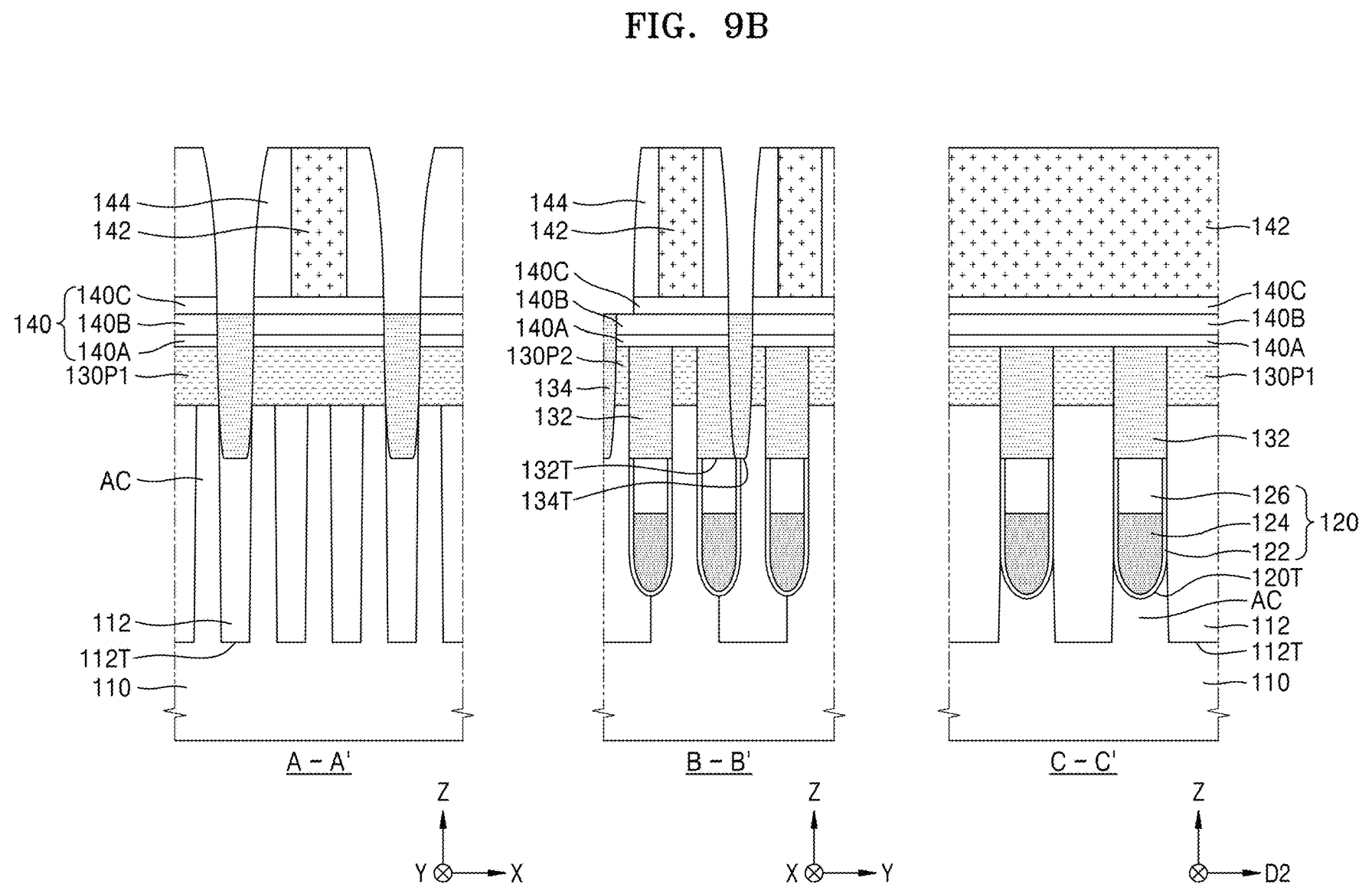

Referring to FIGS. 9A and 9B, portions of the buffer insulating layer 140, the cell pad line pattern 130P1, and the substrate 110 may be removed by using the reference pattern 142 and the pair of spacers 144 as an etch mask, and thus, a second cell pad separation trench 134T extending in the second diagonal direction D2 may be formed.

A plurality of second cell pad separation patterns 134 may be formed by forming an insulating layer in the second cell pad separation trench 134T and etching back an upper portion of the insulating layer.

In an embodiment of the present inventive concept, the plurality of second cell pad separation patterns 134 may extend in the second diagonal direction D2. In addition, top surfaces of the plurality of second cell pad separation patterns 134 may be located at a level lower than that of top surfaces of the reference pattern 142 and the pair of spacers 144. In addition, a plurality of cell pad preliminary patterns 130P2 may be formed from the cell pad line patterns 130P1, by forming the plurality of first cell pad separation patterns 132 extending in the first horizontal direction X and the plurality of second cell pad separation patterns 134 extending in the second diagonal direction D2. Each of the plurality of cell pad preliminary patterns 130P2 may have a parallelogram-shaped horizontal cross-section. For example, one cell pad preliminary pattern 130P2 may be located between two adjacent first cell pad separation patterns 132 and two adjacent second cell pad separation patterns 134, and the one cell pad preliminary pattern 130P2 may include two first side walls contacting two first cell pad separation patterns 132 and two second side walls contacting two second cell pad separation patterns 134. For example, the one cell pad preliminary pattern 130P2 may be at least partially surrounded by two first cell pad separation patterns 132 and two second cell pad separation patterns 134 in a plan view.

Figure 10A:
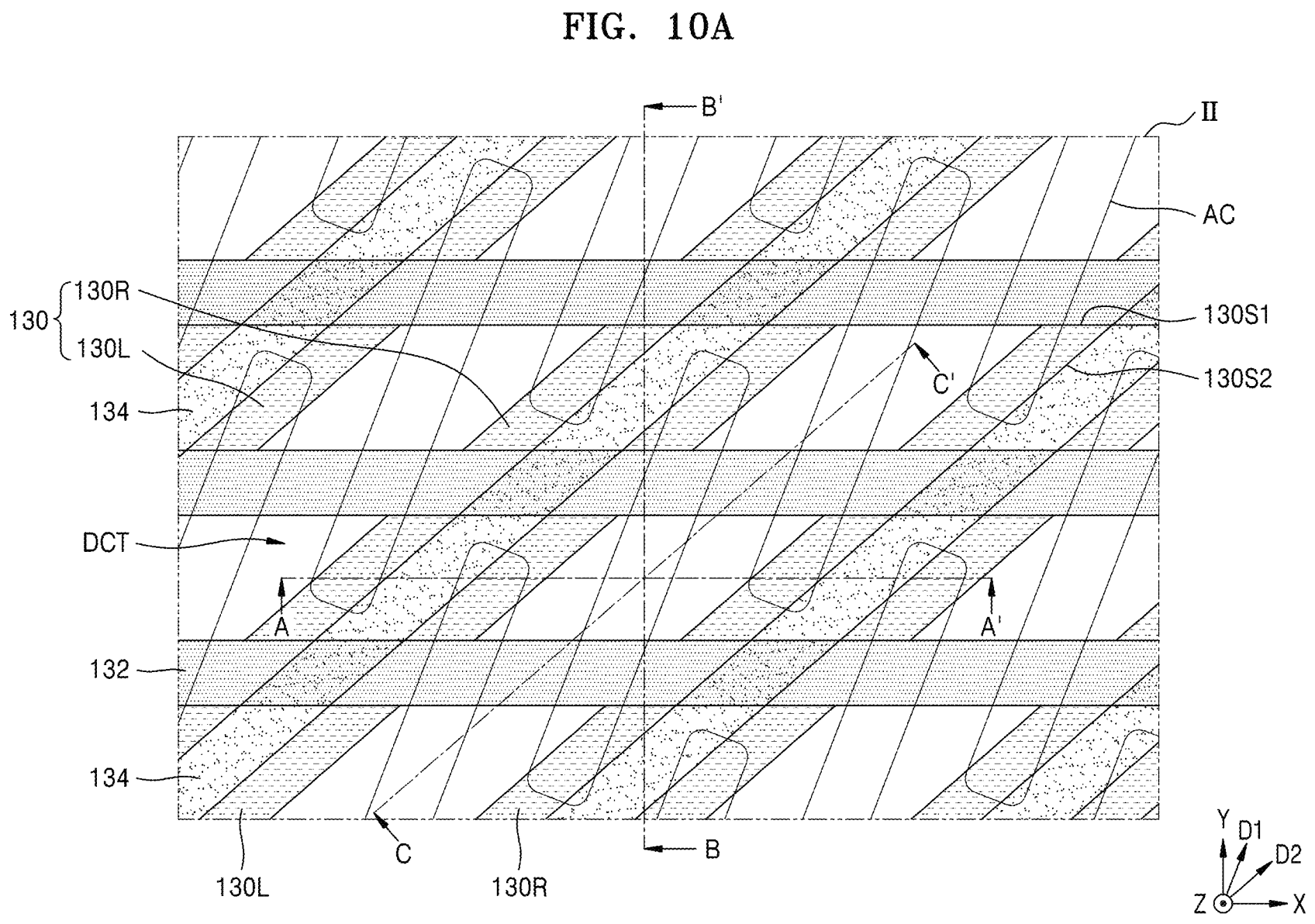
Figure 10B:
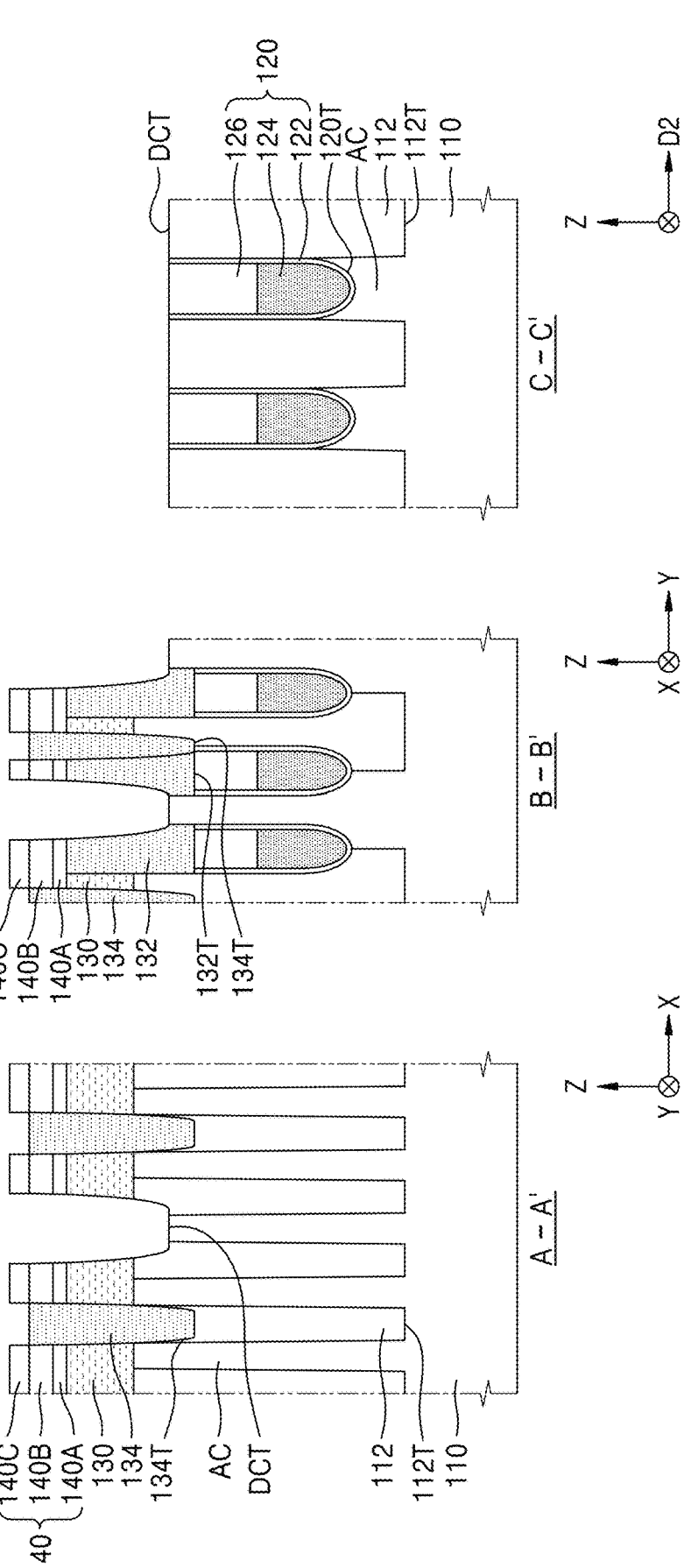

Referring to FIGS. 10A and 10B, the reference pattern 142 and the spacer 144 may be removed. Next, the direct contact trench DCT may be formed by further removing portions of the buffer insulating layer 140, the cell pad preliminary pattern 130P2, and the substrate 110 in an area where the reference pattern 142 and the spacer 144 are removed.

In an embodiment of the present inventive concept, the direct contact trench DCT may extend in the second diagonal direction D2. For example, a bottom surface of the direct contact trench DCT may have a flat profile in the second diagonal direction D2.

The direct contact trench DCT may be located between two adjacent second cell pad separation patterns 134 and may extend parallel to the two second cell pad separation patterns 134, and thus, a portion of the cell pad preliminary pattern 130P2 may be removed to form a pair of cell pad structures 130. In a plan view, the direct contact trench DCT may be located between the pair of cell pad structures 130, and each cell pad structure 130 may have a parallelogram-shaped horizontal cross-section. One cell pad structure 130 may include a pair of first side walls 130S1 extending in the first horizontal direction X, and a pair of second side walls 130S2 extending in the second diagonal direction D2.

In an embodiment of the present inventive concept, the direct contact trench DCT may include a bottom portion located at a level higher than that of bottom surfaces of the plurality of first cell pad separation patterns 132 and bottom surfaces of the plurality of second cell pad separation patterns 134.

Figure 11A:
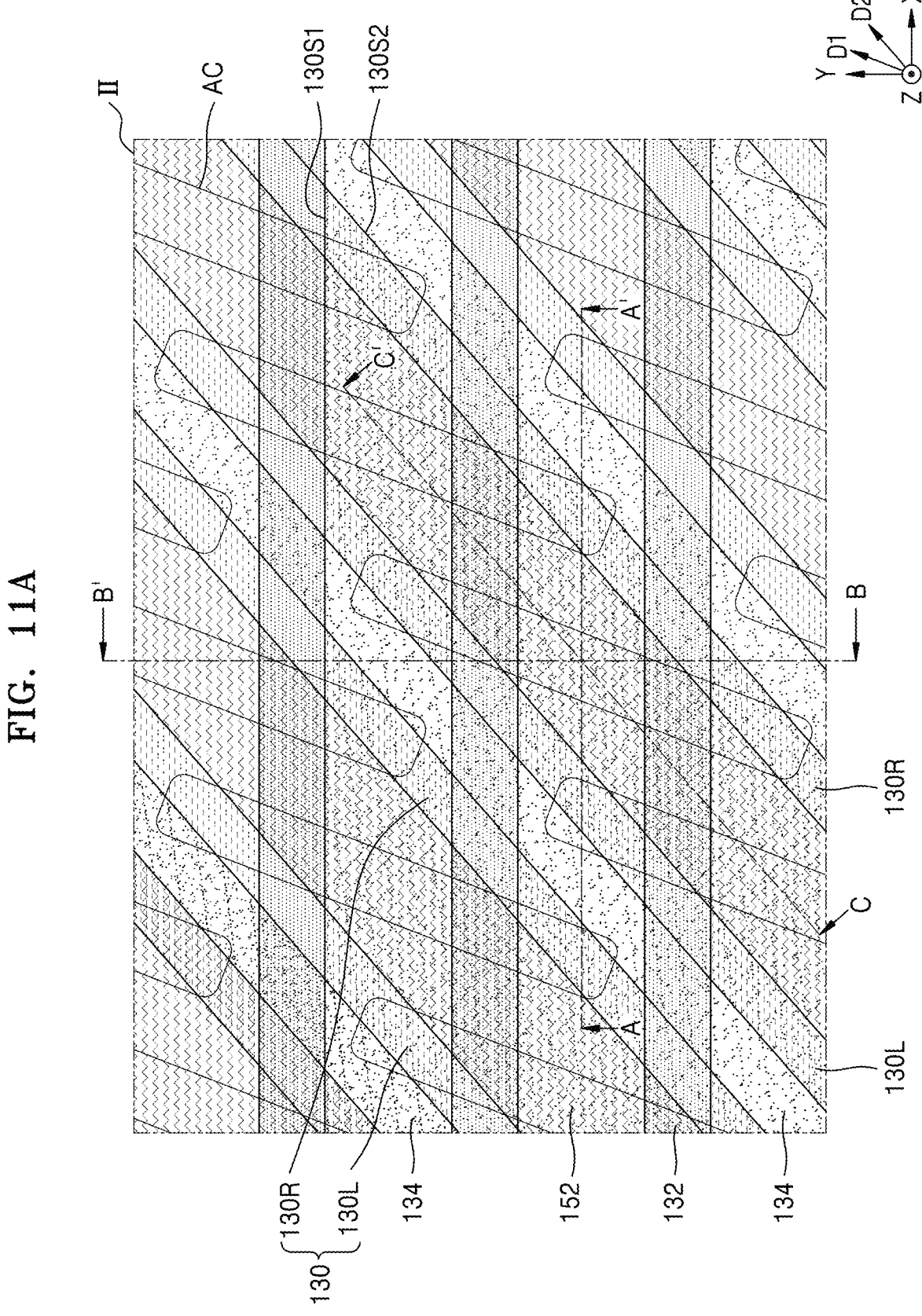
Figure 11B:
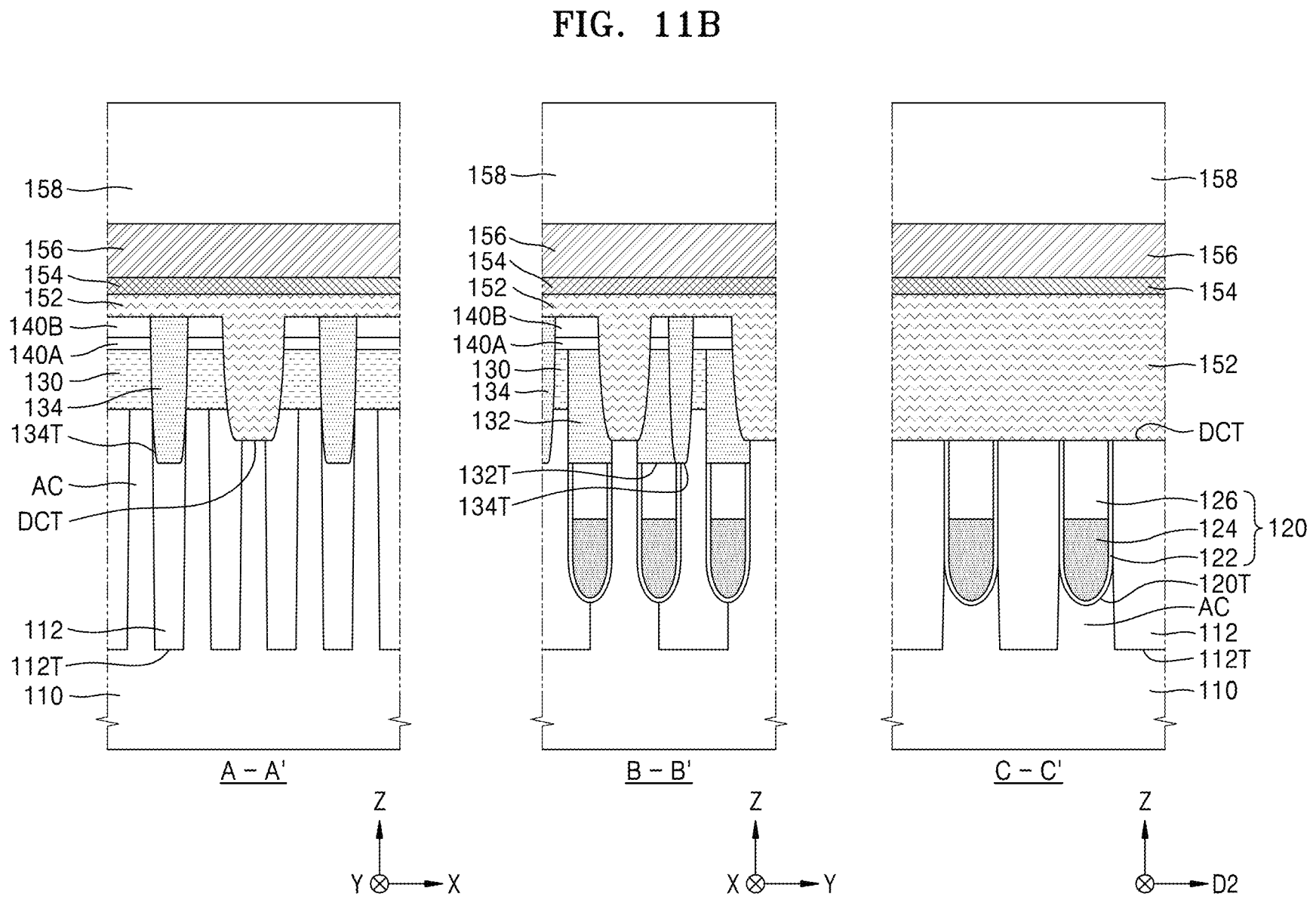

Referring to FIGS. 11A and 11B, the third insulating layer 140C of the buffer insulating layer 140 may be removed to expose a top surface of the second insulating layer 140B.

Next, the conductive layer 152 filling the direct contact trench DCT may be formed on the plurality of cell pad structures 130, the plurality of first cell pad separation patterns 132, and the plurality of second cell pad separation patterns 134. For example, the conductive layer 152 may penetrate the plurality of cell pad structures 130, and may be disposed on side surfaces of the first cell pad separation patterns 132. A portion of the conductive layer 152 may extend in the second diagonal direction D2. For example, a portion of the conductive layer 152 may extend at a certain angle with respect to the plurality of first cell pad separation patterns 132. In an embodiment of the present inventive concept, a portion of the conductive layer 152 may extend at a certain angle with respect to the plurality of second cell pad separation patterns 134. In an embodiment of the present inventive concept, the conductive layer 152 may include polysilicon.

Next, the intermediate conductive layer 154, the bit line conductive layer 156, and the bit line capping layer 158 may be formed on the conductive layer 152.

In an embodiment of the present inventive concept, the intermediate conductive layer 154 may include at least one of TiN, TiSiN, cobalt silicide, nickel silicide, and/or tungsten silicide. The bit line conductive layer 156 may include at least one of ruthenium (Ru), tungsten (W), cobalt (Co), titanium (Ti), and/or titanium nitride (TiN).

Figure 12A:
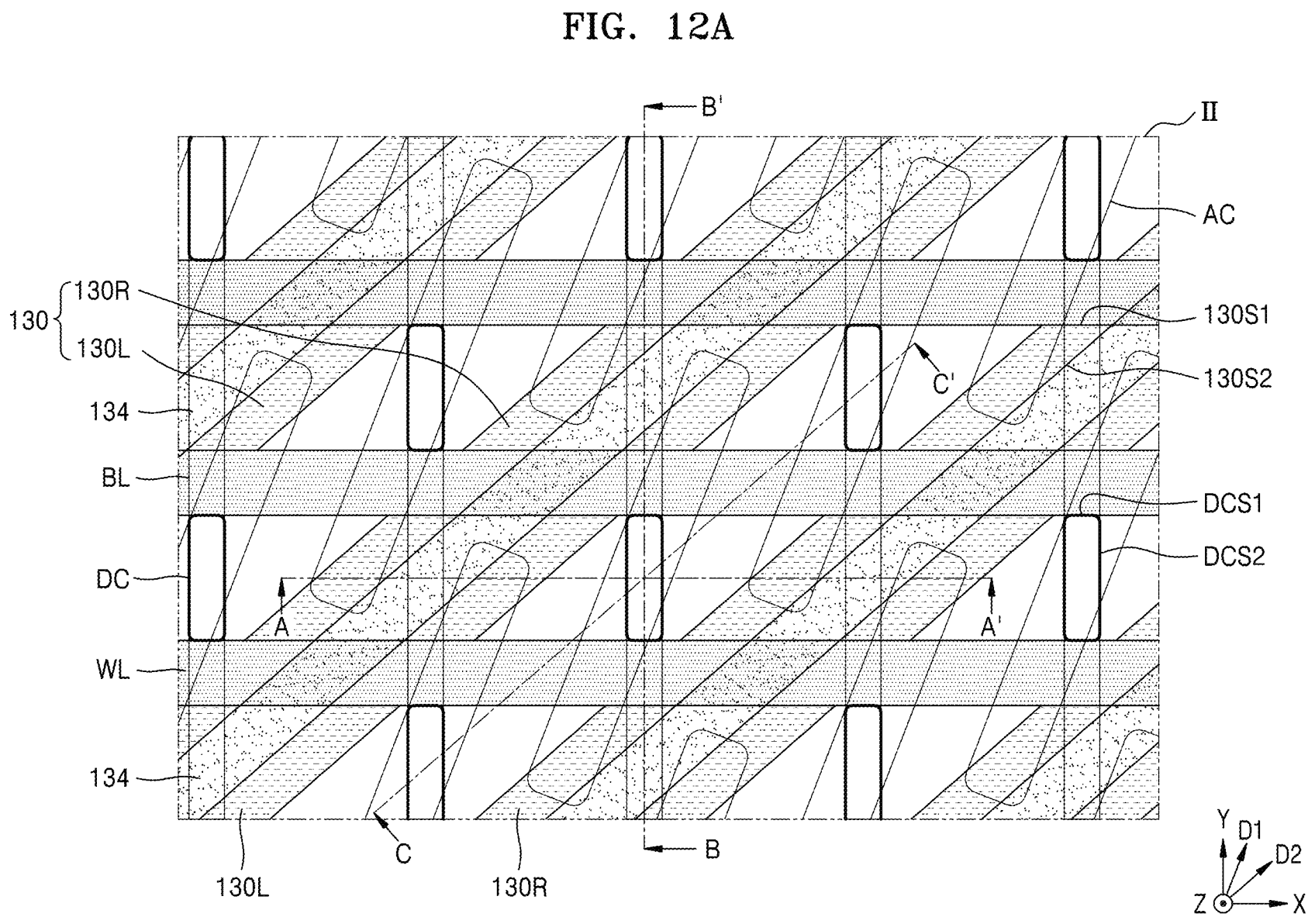
Figure 12B:
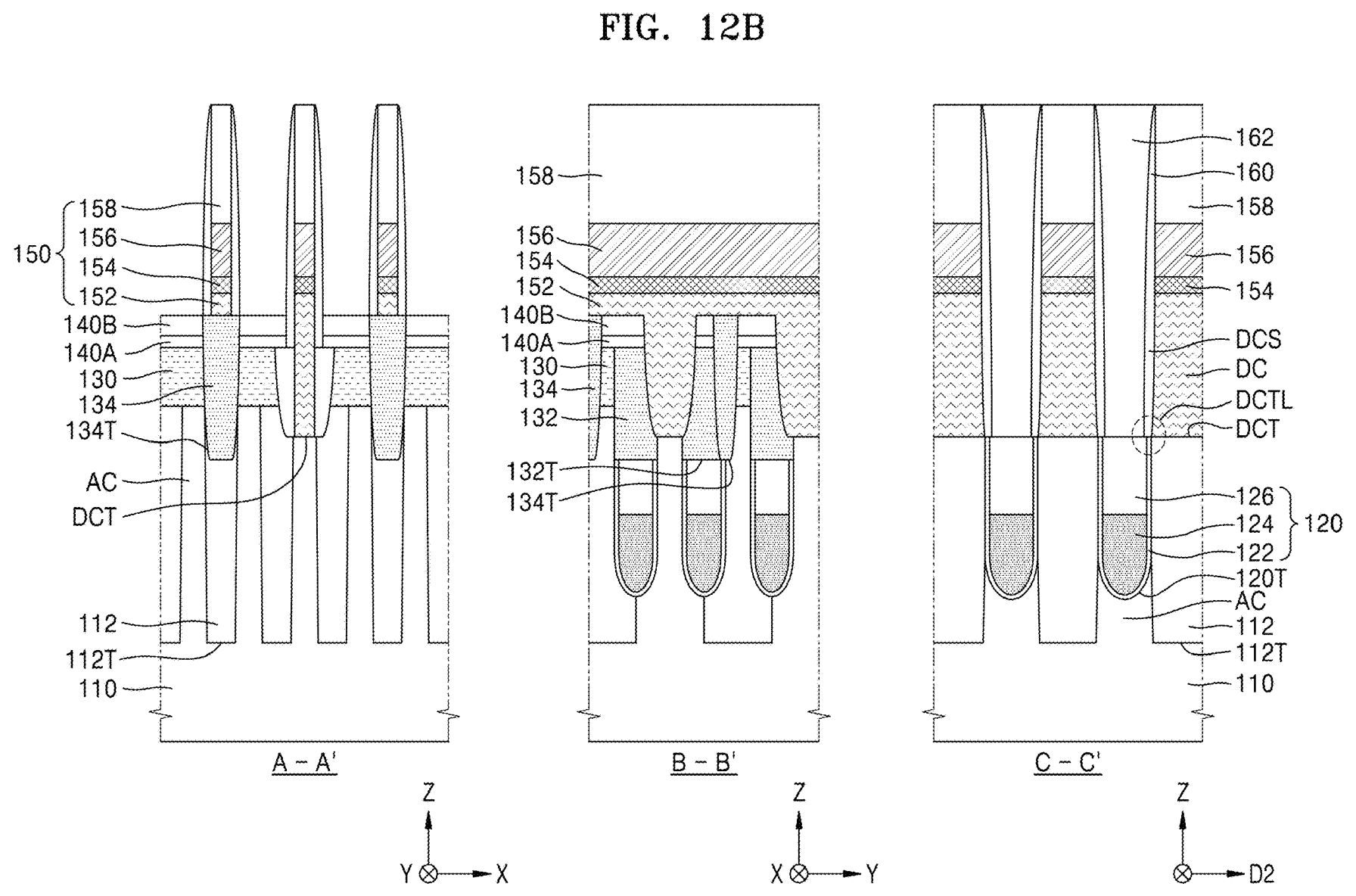

Referring to FIGS. 12A and 12B, the bit line structure 150 may be formed by forming a mask pattern on the bit line capping layer 158, and patterning the bit line capping layer 158, the bit line conductive layer 156, the intermediate conductive layer 154, and the conductive layer 152 by using the mask pattern.

The bit line structure 150 may extend in the second horizontal direction Y, and a portion of the conductive layer 152 having a relatively large depth, when compared to other portions of the conductive layer 152, may be formed at a portion where the direct contact trench DCT and the bit line structure 152 intersect each other. For example, a first portion of the conductive layer 152 may be disposed in the direct contact trench DCT, and a bottom surface of the first portion of the conductive layer 152 may contact the bottom surface of the direct contact trench DCT. A portion of the conductive layer 152 located between the intermediate conductive layer 154, the bit line conductive layer 156 and the bit line capping layer 158 of the bit line structure 150 and the active area AC at the portion where the direct contact trench DCT and the bit line structure 150 intersect each other may be referred to as the direct contact DC.

In a process for forming the direct contact DC, the tail portions DCTL may be formed on both side walls of the direct contact DC at a bottom portion of the direct contact trench DCT, but the present inventive concept is not limited thereto.

Next, the bit line spacer 160 may be formed on a side wall of the bit line structure 150. A portion of the bit line spacer 160 may be located on a side wall of the direct contact DC, and a portion of the bit line spacer 160 surrounding the side wall of the direct contact DC may be referred to as the direct contact spacer DCS.

Next, a plurality of insulating fences 162 may be formed between the plurality of bit line structures 150. The plurality of insulating fences 162 may fill the bottom portion of the direct contact trench DCT and may be formed at the same height as top surfaces of the plurality of bit lines BL.

Figure 13A:
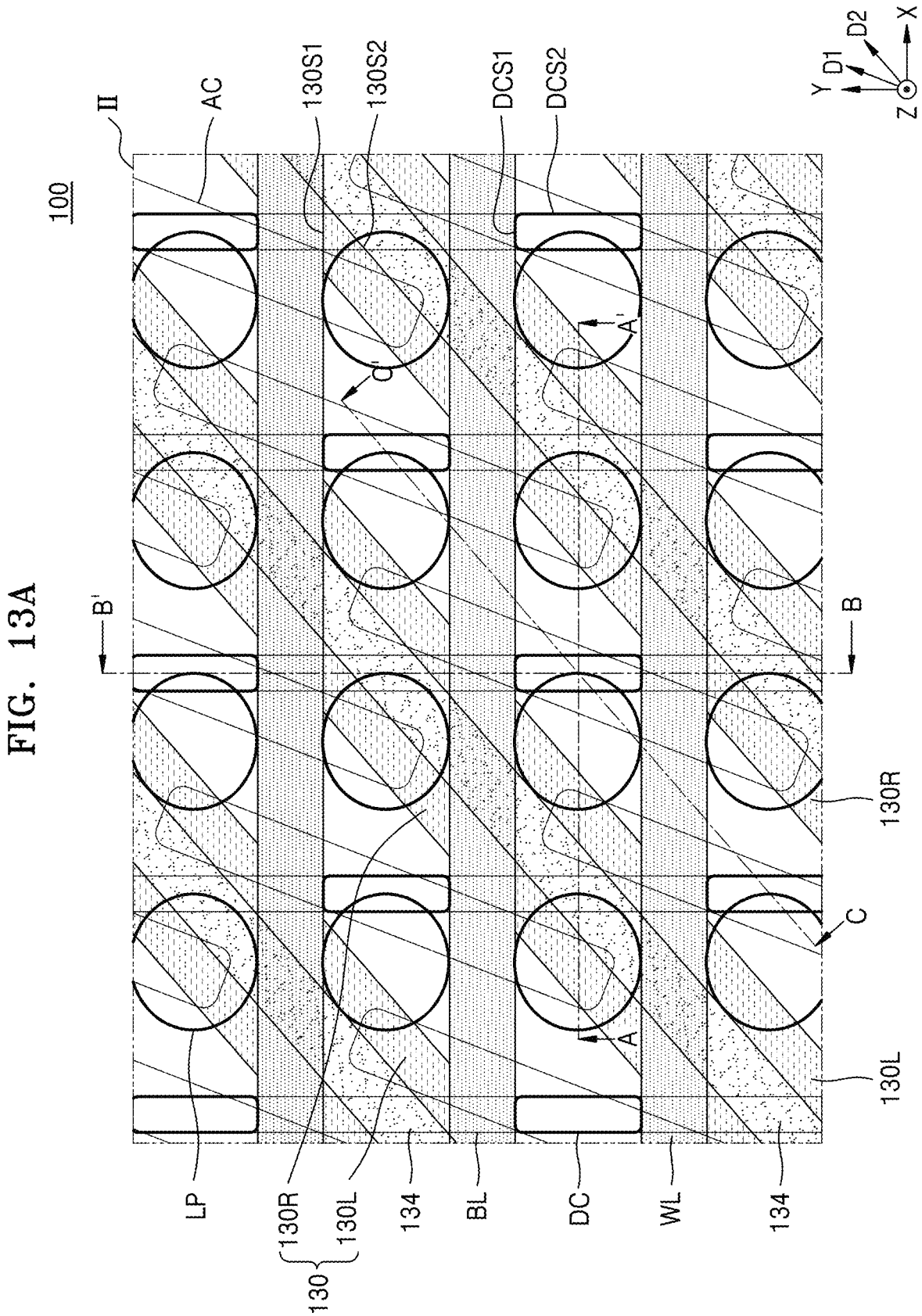
Figure 13B:
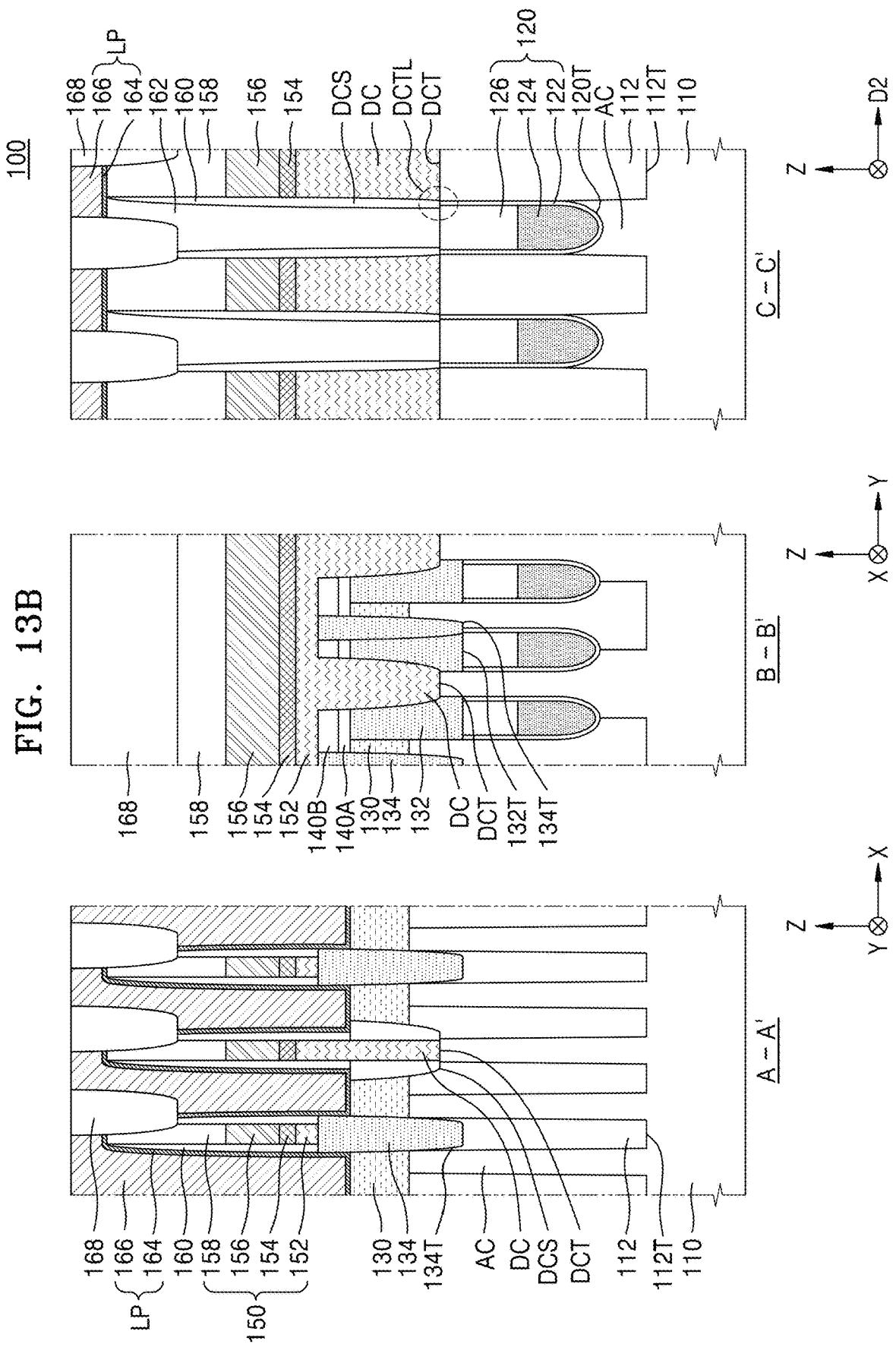

Referring to FIGS. 13A and 13B, a top surface of the cell pad structure 130, which is between the bit line structures 150, may be exposed by removing the second insulating layer 140B and the first insulating layer 140A.

Next, the conductive barrier film 164 and the landing pad conductive layer 166 covering the exposed surface of the cell pad structure 130 are formed on the cell pad structure 130. A plurality of landing pads LP including the conductive barrier film 164 and the landing pad conductive layer 166 may be formed by patterning the conductive barrier film 164 and the landing pad conductive layer 166.

Next, the insulating pattern 168 covering the plurality of landing pads LP may be formed.

Next, a plurality of lower electrodes connected to the landing pads LP may be formed, and a capacitor dielectric layer and an upper electrode may be sequentially formed on side walls of the plurality of lower electrodes.

The semiconductor apparatus 100 may be completed by performing the above method.

In general, according to a comparative example, an island-type direct contact hole is formed by removing a portion of a cell pad structure, and a direct contact is formed by filling a conductive material in the direct contact hole. However, when misalignment occurs in a patterning process for forming the direct contact hole, a cell pad structure having a small area may be locally formed, and in this case, contact resistance between an active area and a landing pad may increase, thereby degrading electrical characteristics of a semiconductor apparatus.

However, according to an embodiment of the present inventive concept, the cell pad preliminary pattern 130P2 may be by forming the first cell pad separation pattern 132 and the second cell pad separation pattern 134 to intersect each other at an acute angle, and then the first cell pad 132L and the second cell pad 132R may be formed by forming the direct contact trench DCT through double patterning using the spacer 144 and the reference pattern 142 extending in the second diagonal direction D2. Accordingly, the first cell pad 132L and the second cell pad 132R may be formed to have the same or substantially the same area, and the semiconductor apparatus 100 may have excellent electrical characteristics.

In addition, according to an embodiment of the present inventive concept, the direct contact trench DCT may be formed in a process for patterning the cell pad structure 130, without separately performing a patterning process for forming the direct contact hole. Accordingly, a process for forming the cell pad structure 130 and the direct contact DC may be simplified. In addition, because the cell pad structure 130 is patterned in a self-alignment manner by using the reference pattern 142 and the spacer 144, the cell pad structure 130 having a relatively small width within a resolution limit of photolithography may be formed.

A method of forming the direct contact DC by directly filling the conductive layer 152 on an inner wall of the direct contact trench DCT and patterning the conductive layer 152 has been described with reference to FIGS. 6A through 13B. In an embodiment of the present inventive concept, before the conductive layer 152 is formed on the inner wall of the direct contact trench DCT, the insulating liner 172 may be conformably formed on the inner wall of the direct contact trench DCT, a portion of the insulating liner 172 covering a bottom portion of the active area AC may be removed, and the conductive layer 152 filling the inside of the direct contact trench DCT may be formed on the insulating liner 172. In this case, the semiconductor apparatus 100A described with reference to FIGS. 4 and 5 may be formed. According to the above embodiments, even when an interval between the direct contact DCA and the cell pad structure 130 is relatively small, process defects in which the cell pad structure and the direct contact DCA are electrically connected to each other may be prevented.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor apparatus comprising:
    a substrate in which a plurality of active areas are provided;
    a plurality of word lines formed on the substrate and located in a plurality of word line trenches extending in a first direction parallel to a top surface of the substrate;
    a plurality of bit line structures formed on the substrate, and extending in a second direction parallel to the top surface of the substrate and crossing the first direction; and
    a plurality of cell pad structures at least partially overlapping the plurality of active areas with the plurality of bit line structures therebetween, wherein each of the plurality of cell pad structures comprises a pair of first side walls extending in the first direction in a plane defined by the first and second directions and a pair of second side walls extending in a diagonal direction inclined with respect to the first direction and the second direction in the plane.

2. The semiconductor apparatus of claim 1, wherein the plurality of cell pad structures comprise a first cell pad and a second cell pad,
    wherein each of the first cell pad and the second cell pad has a parallelogram shape.

3. The semiconductor apparatus of claim 2, wherein a horizontal cross-sectional area of the first cell pad is a same as a horizontal cross-sectional area of the second cell pad.

4. The semiconductor apparatus of claim 2, further comprising:
    a plurality of first cell pad separation patterns extending in the first direction on the substrate, and overlapping the pair of first side walls of the plurality of cell pad structures; and
    a plurality of second cell pad separation patterns extending in the diagonal direction on the substrate, and overlapping the pair of second side walls of the plurality of cell pad structures.

5. The semiconductor apparatus of claim 4, wherein the first cell pad, the bit line structure, and the second cell pad are spaced apart from one another, between two adjacent first cell pad separation patterns from among the plurality of first cell pad separation patterns and between two adjacent second cell pad separation patterns from among the plurality of second cell pad separation patterns.

6. The semiconductor apparatus of claim 4, further comprising a direct contact located in a direct contact trench extending in the second direction and between the plurality of bit line structures and the plurality of active areas,
    wherein the direct contact comprises a pair of first side walls extending in the first direction and a pair of second side walls extending in the second direction.

7. The semiconductor apparatus of claim 6, further comprising an insulating fence located in the direct contact trench, and covering at least one second side wall of the pair of second sidewalls of the direct contact and a side wall of the bit line structure,
    wherein a bottom surface of the insulating fence is located at a same level as a bottom surface of the direct contact.

8. The semiconductor apparatus of claim 6, wherein a bottom surface of the direct contact is located at a level higher than that of bottom surfaces of the first cell pad separation patterns, and the bottom surface of the direct contact is located at a level higher than bottom surfaces of the second cell pad separation patterns.

9. The semiconductor apparatus of claim 6, wherein the direct contact comprises a tail portion protruding outward at a bottom portion of the direct contact.

10. The semiconductor apparatus of claim 4, further comprising a direct contact located in a direct contact trench extending in the second direction and between the plurality of bit line structures and the plurality of active areas, wherein the direct contact comprises a pair of first side walls extending in the diagonal direction and a pair of second side walls extending in the second direction.

11. The semiconductor apparatus of claim 10, further comprising an insulating liner located on an inner wall of the direct contact trench, wherein the insulating liner is located between the pair of first side walls of the direct contact and the pair of second side walls of each of the plurality of the cell pad structures.

12. A semiconductor apparatus comprising:

a substrate in which a plurality of active areas are provided;

a plurality of word lines formed on the substrate and located in a plurality of word line trenches extending in a first direction parallel to a top surface of the substrate;

a plurality of bit line structures formed on the substrate, and extending in a second direction parallel to the top surface of the substrate and crossing the first direction; and a plurality of cell pad structures at least partially overlapping the plurality of active areas with the plurality of bit line structures therebetween, wherein each of the plurality of cell pad structures extends in a diagonal direction inclined with respect to the first direction and the second direction in a plane defined by the first and second directions.

13. The semiconductor apparatus of claim 12, wherein each of the plurality of cell pad structures comprises a pair of first side walls extending in the first direction, and a pair of second side walls extending in the diagonal direction.

14. The semiconductor apparatus of claim 13, wherein each of the plurality of cell pad structures has a parallelogram shape in a plan view.

15. The semiconductor apparatus of claim 13, further comprising:

a plurality of first cell pad separation patterns extending in the first direction on the substrate, and overlapping the pair of first side walls of the plurality of cell pad structures; and a plurality of second cell pad separation patterns extending in the diagonal direction on the substrate, and overlapping the pair of second side walls of the plurality of cell pad structures, wherein a first cell pad structure from among the plurality of cell pad structures, the bit line structure, and a second cell pad structure from among the plurality of cell pad structures are spaced apart from one another, between two adjacent first cell pad separation patterns from among the plurality of first cell pad separation patterns and between two adjacent second cell pad separation patterns from among the plurality of second cell pad separation patterns.

16. The semiconductor apparatus of claim 15, further comprising a direct contact located in a direct contact trench extending in the diagonal direction and between the plurality of bit line structures and the plurality of active areas, wherein the direct contact comprises a pair of first side walls extending in the diagonal direction and a pair of second side walls extending in the second direction.

17. A semiconductor apparatus comprising:

a substrate in which a plurality of active areas are provided;

a plurality of word lines formed on the substrate and located in a plurality of word line trenches extending in a first direction parallel to a top surface of the substrate;

a plurality of bit line structures formed on the substrate, and extending in a second direction parallel to the top surface of the substrate and crossing the first direction;

a plurality of first cell pad separation patterns extending in the first direction on the substrate;

a plurality of second cell pad separation patterns extending in a diagonal direction on the substrate, wherein the diagonal direction extends in a plane defined by the first and second directions between the first direction and the second direction; and a plurality of cell pad structures located in the plurality of active areas, wherein each of the plurality of cell pad structures comprises a first side wall and a second side wall, wherein the first side wall of each of the plurality of cell pad structures contacts one of the plurality of first cell pad separation patterns, and the second side wall of each of the plurality of cell pad structures contacts one of the plurality of second cell pad separation patterns.

18. The semiconductor apparatus of claim 17, further comprising a direct contact located in a direct contact trench extending in the diagonal direction and between the plurality of bit line structures and the plurality of active areas, wherein the direct contact comprises a pair of first side walls extending in the diagonal direction and a pair of second side walls extending in the second direction.

19. The semiconductor apparatus of claim 17, wherein a first cell pad structure from among the plurality of cell pad structures, the bit line structure, and a second cell pad structure from among the plurality of cell pad structures are spaced apart from one another, between two adjacent first cell pad separation patterns from among the plurality of first cell pad separation patterns and between two adjacent second cell pad separation patterns from among the plurality of second cell pad separation patterns.

20. The semiconductor apparatus of claim 19, wherein the first cell pad structure and the second cell pad structure have a same horizontal cross-sectional area.

* * * * *